United States Patent
Yokomizo et al.

(10) Patent No.: US 9,845,538 B2
(45) Date of Patent: Dec. 19, 2017

(54) ETCHING AGENT, ETCHING METHOD AND ETCHING AGENT PREPARATION LIQUID

(71) Applicant: WAKO PURE CHEMICAL INDUSTRIES, LTD., Osaka-shi, Osaka (JP)

(72) Inventors: Takahiro Yokomizo, Kawagoe (JP); Hiroyuki Tsurumoto, Kawagoe (JP); Masahiko Kakizawa, Kawagoe (JP)

(73) Assignee: WAKO PURE CHEMICAL INDUSTRIES, LTD., Osaka-shi (JP)

(*) Notice: Subject to any disclaimer, the term of this patent is extended or adjusted under 35 U.S.C. 154(b) by 0 days.

(21) Appl. No.: 14/902,667

(22) PCT Filed: Jul. 3, 2014

(86) PCT No.: PCT/JP2014/067812
§ 371 (c)(1),
(2) Date: Jan. 4, 2016

(87) PCT Pub. No.: WO2015/002272
PCT Pub. Date: Jan. 8, 2015

(65) Prior Publication Data
US 2016/0177457 A1    Jun. 23, 2016

(30) Foreign Application Priority Data
Jul. 5, 2013  (JP) ................................. 2013-141807

(51) Int. Cl.
*C09K 13/02*  (2006.01)
*C23F 1/38*  (2006.01)
*H01L 21/3213*  (2006.01)

(52) U.S. Cl.
CPC .......... *C23F 1/38* (2013.01); *H01L 21/32134* (2013.01)

(58) Field of Classification Search
USPC ........................................................ 252/79.5
See application file for complete search history.

(56) References Cited

U.S. PATENT DOCUMENTS

| 5,783,489 | A * | 7/1998 | Kaufman | C09G 1/02 |
| | | | | 106/3 |
| 6,527,817 | B1 * | 3/2003 | Fang | C09G 1/02 |
| | | | | 257/E21.304 |

| 2011/0230053 | A1 | 9/2011 | Matsuda et al. |
| 2012/0319033 | A1 | 12/2012 | Okabe et al. |
| 2014/0162403 | A1 | 6/2014 | Okabe et al. |

FOREIGN PATENT DOCUMENTS

| JP | 2000-311891 | A | 11/2000 |
| JP | 2002-25965 | A | 1/2002 |
| JP | 2002-155382 | A | 5/2002 |
| JP | 2003-328159 | A | 11/2003 |
| JP | 2004-31791 | A | 1/2004 |
| JP | 2005-163108 | A | 6/2005 |
| JP | 2005-320608 | A | 11/2005 |
| JP | 2009-266984 | A | 11/2009 |
| WO | 2009/081884 | A1 | 7/2009 |
| WO | 2011/099624 | A1 | 8/2011 |
| WO | 2013/015322 | A1 | 1/2013 |

OTHER PUBLICATIONS

International Search Report dated Sep. 22, 2014, issued in counterpart International Application No. PCT/JP2014/067812 (2 pages).

* cited by examiner

*Primary Examiner* — Roberts Culbert
(74) *Attorney, Agent, or Firm* — Westerman, Hattori, Daniels & Adrian, LLP

(57) ABSTRACT

The object of the present invention is to provide: an etching agent for a titanium-based metal on a semiconductor substrate, which suppresses decomposition of hydrogen peroxide, has a long liquid service life, and has less need for controlling the concentration of hydrogen peroxide in the etching agent, even in the cases where the etching agent is used for a semiconductor substrate having the titanium-based metal and a metallic copper or a metal alloy; an etching method; and an etching agent preparation liquid for use by mixing with hydrogen peroxide.

The present invention relates to: an etching agent for a titanium-based metal on a semiconductor substrate, having a titanium-based metal and a metallic copper or a copper alloy on the upper part of the titanium-based metal, comprising an aqueous solution containing at least (A) hydrogen peroxide, (B) phosphonic acid-based chelating agent having a nitrogen atom in the structure, (C) alkali metal hydroxide, and (D) organic acid having at least one hydroxyl group and at least three carboxyl groups; an etching method, which comprises using the etching agent; and an etching agent preparation liquid for use by mixing with hydrogen peroxide.

10 Claims, No Drawings

ETCHING AGENT, ETCHING METHOD AND ETCHING AGENT PREPARATION LIQUID

TECHNICAL FIELD

The present invention relates to the processing of a titanium (hereafter it may be abbreviated as Ti)-based metal in a semiconductor substrate having a titanium-based metal, and in more detail, relates to an etching agent for a titanium-based metal, such as, for example, a metallic titanium, a titanium-tungsten (hereafter it may be abbreviated as TiW) alloy on a semiconductor substrate having a titanium-based metal and a metallic copper or a copper alloy on the upper part of the titanium-based metal; and an etching method, or the like.

BACKGROUND ART

In a semiconductor device represented by a silicon semiconductor, a miniaturization and a higher integration have been progressing in response to market needs such as higher performance and compact sizing. In accordance with the miniaturization and higher integration, as a metal for forming a fine wiring pattern, copper is mainly used due to having low wiring resistance. As a barrier layer to such a copper wiring, there has been known a metal layer (metal film) composed of a metallic titanium, a metal layer (metal film) composed of a metallic tungsten, an alloy layer (alloy film) of these metals, or the like.

In a formation process of a metal wiring, it is necessary to etch a metal composing such a barrier layer, and as an etching solution for etching these metals, an acidic etching solution, such as, for example, a mixed solution of hydrofluoric acid and hydrogen peroxide, a mixed solution of phosphoric acid and hydrogen peroxide, has been used conventionally.

However, since decomposition of hydrogen peroxide is promoted by a metal, such as, for example, copper, silver or gold, an etching solution containing the hydrogen peroxide has been known to have problems of a short solution life-time, and necessity of suitable control of concentration of hydrogen peroxide in the etching solution, and the like.

In addition, an etching solution containing hydrogen peroxide has been known to have problems of oxidation of the surface of the copper wiring, corrosion of the metal wiring such as a copper wiring, other than the problem of decomposition of hydrogen peroxide.

As an etching solution or an etching agent focused on such problems, there have been known conventionally, for example, an etching solution composed of specific amount of hydrogen peroxide and specific amount of a phosphate salt, for etching TiW (for example, PATENT LITERATURE 1); an etching agent composed of a solution containing hydrogen peroxide and a chelating agent, for a Ti-based film on a semiconductor substrate (for example, PATENT LITERATURE 2); a surface preparation agent composed of specific amount of hydrogen peroxide and specific amount of a phosphonic acid-based compound (for example, PATENT LITERATURE 3); an etching solution for etching tungsten and/or titanium-tungsten alloy, characterized by containing at least hydrogen peroxide water and an alkali component, and being a pH of 7 or lower, under presence of a metal having good electrical conductivity for a wiring or an electrode (for example, PATENT LITERATURE 4); an etching agent, which is an aqueous solution of an acidic region having a pH of 3.0 to 7.0, characterized by containing hydrogen peroxide, an alkali metal ion and an anticorrosive (for example, PATENT LITERATURE 5); an etching agent, which is an aqueous solution of an alkali region having a pH of over 7.0 to 8.0, characterized by containing hydrogen peroxide and an alkali metal ion from a supply source of a caustic alkali (for example, PATENT LITERATURE 5); an etching solution for a titanium or a titanium alloy film, which is the etching solution for etching the titanium or the titanium alloy under presence of a metal which should not be etched, and is an aqueous solution composed of specific amount of hydrogen peroxide, specific amount of phosphoric acid, specific amount of a phosphonic acid-based compound and ammonia (for example, PATENT LITERATURE 6); an etching agent for a semiconductor substrate, composed of a solution containing at least hydrogen peroxide, a phosphonic acid-based chelating agent having a hydroxyl group and a basic compound, and an anticorrosive and/or two or more kinds of anion species not having oxidation power, other than specific amount of the phosphonic acid-based chelating agent having a hydroxyl group (for example, PATENT LITERATURE 7); and the like.

CITATION LIST

Patent Literature

PATENT LITERATURE 1: JP-A-2000-311891
PATENT LITERATURE 2: JP-A-2002-155382
PATENT LITERATURE 3: JP-A-2003-328159
PATENT LITERATURE 4: JP-A-2004-31791
PATENT LITERATURE 5: JP-A-2005-163108
PATENT LITERATURE 6: JP-A-2005-320608
PATENT LITERATURE 7: WO2009/081884

SUMMARY OF INVENTION

Technical Problem

According to cleaning process using these etching solutions or etching agents, it has been said that selective etching of titanium or tungsten is possible without corrosion of a metal wiring, and these etching solutions or etching agents have been used in a cleaning process of a semiconductor substrate.

However, when these etching agents are used for a semiconductor substrate having a titanium-based metal and larger volume of a metallic copper or a copper alloy relative to the titanium-based metal, it has been found that due to larger volume of the metallic copper or the copper alloy relative to titanium, too high dissolution amount of copper (copper oxide) from the metallic copper or the copper alloy, there are problems of inducing decomposition of hydrogen peroxide by eluted copper (copper oxide), providing a short solution life-time, and necessity of suitable control of concentration of hydrogen peroxide in the etching agent. Under such a background, a development of such an etching agent has been desired that is capable of suppressing decomposition of hydrogen peroxide contained in the etching agent.

The present invention has been made in view of the above-described circumstances, and it is an object of the present invention to provide an etching agent for a titanium-based metal on a semiconductor substrate, which suppresses decomposition of hydrogen peroxide, has a long solution life-time, and does not need to control concentration of hydrogen peroxide in the etching agent, even in the case of use for the semiconductor substrate having the titanium-based metal and a metallic copper or a copper alloy; the etching method, characterized by using the etching agent; and the etching agent preparation liquid to use by mixing with hydrogen peroxide.

Solution to Problem

The present invention is composed of the following constitutions.

(1) An etching agent for a titanium-based metal on a semiconductor substrate, having a titanium-based metal and a metallic copper or a copper alloy on the upper part of the titanium-based metal, comprising an aqueous solution containing at least the following (A), (B), (C) and (D):

(A) hydrogen peroxide;
(B) phosphonic acid-based chelating agent having a nitrogen atom in the structure;
(C) alkali metal hydroxide;
(D) organic acid having at least one hydroxyl group and at least three carboxyl groups.

(2) An etching method, which comprises carrying out selective etching of a titanium-based metal on a semiconductor substrate, having a titanium-based metal and a metallic copper or a copper alloy on the upper part of the titanium-based metal, by using an etching agent, which comprises an aqueous solution containing at least the following (A), (B), (C) and (D):

(A) hydrogen peroxide;
(B) phosphonic acid-based chelating agent having a nitrogen atom in the structure;
(C) alkali metal hydroxide;
(D) organic acid having at least one hydroxyl group and at least three carboxyl groups.

(3) An etching agent preparation liquid for preparing an etching agent for a titanium-based metal on a semiconductor substrate, having a titanium-based metal and a metallic copper or a copper alloy on the upper part of the titanium-based metal, comprising an aqueous solution containing at least the following (B), (C) and (D), and being the one for mixing with a solution containing (A) hydrogen peroxide:

(B) phosphonic acid-based chelating agent having a nitrogen atom in the structure;
(C) alkali metal hydroxide;
(D) organic acid having at least one hydroxyl group and at least three carboxyl groups.

Advantageous Effects of Invention

The etching agent of the present invention is an etching agent to be used in a process for etching a titanium-based metal, such as, for example, a metallic titanium, a titanium-tungsten alloy on a semiconductor substrate, having a titanium-based metal and a metallic copper or a copper alloy on the upper part of the titanium-based metal, in a manufacturing process of a semiconductor device; and the etching agent exerts effect of a long solution life-time of the etching agent, and less necessity of control of concentration of hydrogen peroxide in the etching agent, due to suppression of decomposition of hydrogen peroxide, even in use for such a semiconductor substrate.

In addition, the etching method of the present invention is an effective method for etching a titanium-based metal on a semiconductor substrate, having a titanium-based metal and a metallic copper or a copper alloy on the upper part of the titanium-based metal, and by using the etching agent of the present invention, such effect is exerted as stable etching rate, resulting in being capable of stably obtaining a semiconductor substrate where desired amount of a titanium-based metal is etched, due to little generation of concentration change of hydrogen peroxide in the etching agent.

Still more, the etching agent preparation liquid of the present invention is a preparation liquid which is capable of providing the etching agent of the present invention by mixing with hydrogen peroxide, and by preparation in use by mixing hydrogen peroxide and the above-described etching agent preparation liquid, for example, in use of the etching agent of the present invention, such effect is exerted as being capable of suppressing decomposition of hydrogen peroxide, and making a solution life-time of the etching agent still more longer.

The present inventors have intensively studied a way to achieve the above-described objects and as a result, have found that elution of copper (copper oxide) from a metallic copper or a copper alloy can be decreased most, by using an organic acid having at least one hydroxyl group and at least three carboxyl groups, among conventionally known copper anticorrosive, and still more decomposition of hydrogen peroxide caused by copper (copper oxide) can be suppressed, by chelating the copper, more specifically the copper oxide, eluted from the metallic copper or the copper alloy, by using a phosphonic acid-based chelating agent having a nitrogen atom in the structure, among various chelating agents. That is, by combination of the phosphonic acid-based chelating agent having a nitrogen atom in the structure and the organic acid having at least one hydroxyl group and at least three carboxyl groups, elution of the copper (copper oxide) from the metallic copper or the copper alloy can be suppressed, and even when the copper (copper oxide) is eluted, adverse influence on hydrogen peroxide can be decreased by chelating the copper (copper oxide). We have found that a titanium-based metal on a semiconductor substrate, having a titanium-based metal and a metallic copper or a copper alloy, can be stably etched, because of capability of suppressing decomposition of hydrogen peroxide by such mechanism, and have thus completed the present invention.

DESCRIPTION OF EMBODIMENTS

In the present invention, a titanium-based metal (Ti-based metal) means a metal having Ti as a main component, such as Ti or a titanium-tungsten alloy (a TiW alloy).

—An Etching Agent for a Titanium-Based Metal of the Present Invention—

The etching agent of the present invention is an aqueous solution containing at least (A) hydrogen peroxide, (B) phosphonic acid-based chelating agent having a nitrogen atom in the structure, (C) alkali metal hydroxide and (D) organic acid having at least one hydroxyl group and at least three carboxyl groups.

(A) hydrogen peroxide is used aiming at oxidizing the Ti-based metal to make dissolution of the Ti-based metal easy by the alkali metal hydroxide, and includes, for example, commercially available hydrogen peroxide water etc. More specifically, such hydrogen peroxide may be used, that is obtained by diluting, for example, commercially available 35% or 60% hydrogen peroxide water to concentration to be described later by using, for example, purified water such as distilled water, deionized water, or ultra-pure water etc.

(B) phosphonic acid-based chelating agent having a nitrogen atom in the structure is used aiming at forming a water-soluble complex by coordination to the oxidized Ti-based metal to make dissolution of the Ti-based metal easy, as well as suppressing decomposition of hydrogen peroxide caused by copper (copper oxide), by chelating the copper eluted from metallic copper or copper alloy, more specifically, copper oxide. Such a phosphonic acid-based chelating agent includes the one represented by the following general formula [1] or [2].

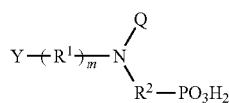
[1]

(wherein Q represents a hydrogen atom or a group represented by —$R^2$—$PO_3H_2$, $R^1$ and $R^2$ each independently represent an alkylene group, Y represents a hydrogen atom, a group represented by —$R^2$—$PO_3H_2$ or a group represented by the following general formula [3], m represents 0 or 1, provided that when Y represents a group represented by the following general formula [3], m represents 1.)

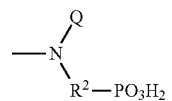
[3]

(wherein Q and $R^2$ are the same as described above.)

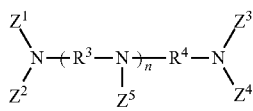
[2]

(wherein $R^3$ and $R^4$ each independently represent an alkylene group having 1 to 4 carbon atoms, n represents an integer of 1 to 4, and at least 4 among $Z^1$ to $Z^4$ and n pieces of $Z^5$ represent an alkyl group having a phosphonic acid group, and the remaining groups represent an alkyl group.)

An alkylene group represented by $R^1$ in the general formula [1] includes a straight chained or branched group having 1 to 12 carbon atoms, specifically, for example, a methylene group, an ethylene group, a propylene group, a trimethylene group, an ethylmethylene group, a tetramethylene group, a 2-methylpropylene group, a 2-methyltrimethylene group, an ethylethylene group, a pentamethylene group, a 2,2-dimethyltrimethylene group, a 2-ethyltrimethylene group, a hexamethylene group, a heptamethylene group, an octamethylene group, a 2-ethylhexamethylene group, a nonamethylene group, a decamethylene group, an undecamethylene group, a dodecamethylene group, and the like, and among them, for example, the straight chained or branched alkylene group having 1 to 6 carbon atoms, such as a methylene group, an ethylene group, a propylene group, a trimethylene group, an ethylmethylene group, a tetramethylene group, a 2-methylpropylene group, a 2-methyltrimethylene group, an ethylethylene group, a pentamethylene group, a 2,2-dimethyltrimethylene group, a 2-ethyltrimethylene group, a hexamethylene group are preferable, and among them, an ethylene group which is an alkylene group having 2 carbon atoms is preferable.

An alkylene group represented by $R^2$ in the general formulae [1] and [3] includes the straight chained or branched group having 1 to 10 carbon atoms, specifically, for example, a methylene group, an ethylene group, a propylene group, a trimethylene group, an ethylmethylene group, a tetramethylene group, a 2-methylpropylene group, a 2-methyltrimethylene group, an ethylethylene group, a pentamethylene group, a 2,2-dimethyltrimethylene group, a 2-ethyltrimethylene group, a hexamethylene group, a heptamethylene group, an octamethylene group, a 2-ethylhexamethylene group, a nonamethylene group, a decamethylene group, and the like, and among them, a methylene group, an ethylene group which are alkylene groups having 1 to 2 carbon atoms are preferable, and among them, a methylene group which is an alkylene group having one carbon atom is more preferable.

As Q in the general formulae [1] and [3], a group represented by —$R^2$—$PO_3H_2$ is more preferable.

As Y in the general formula [1], a group represented by —$R^2$—$PO_3H_2$, or a group represented by the general formula [3] is more preferable, and among them, a group represented by —$R^2$—$PO_3H_2$ is particularly preferable.

m in the general formula [1] represents usually 0 or 1, and preferably 0. It should be noted that, when m represents 0, the group represented by $R^1$ in the general formula [1] is not present, and it indicates that a group represented by Y is directly bound to a nitrogen atom.

An alkylene group having 1 to 4 carbon atoms represented by $R^3$ and $R^4$ in the general formula [2] includes the straight chained or branched group, specifically, for example, a methylene group, an ethylene group, a propylene group, a trimethylene group, an ethylmethylene group, a tetramethylene group, a 2-methylpropylene group, a 2-methyltrimethylene group, an ethylethylene group, and the like, and among them, an ethylene group which is an alkylene group having 2 carbon atoms is preferable.

n in the general formula [2] represents usually an integer of 1 to 4, preferably an integer of 1 to 2, and more preferably 1.

An alkyl group represented by $Z^1$ to $Z^5$ in the general formula [2], and an alkyl group in the "alkyl group having a phosphonic acid group" include the straight chained or branched group having 1 to 4 carbon atoms, specifically, for example, a methyl group, an ethyl group, an n-propyl group, an isopropyl group, an n-butyl group, an isobutyl group, a s-butyl group, a t-butyl group, and the like, and among them, a methyl group which is an alkyl group having one carbon atom is preferable. It should be noted that, in the above-described specific examples, n—means normal type, s—means sec-type, and t—means tert-type.

Number of phosphonic acid groups in an alkyl group having a phosphonic acid group represented by $Z^1$ to $Z^5$ in the general formula [2] represents usually 1 to 2, and preferably one.

An alkyl group having a phosphonic acid group represented by $Z^1$ to $Z^5$ in the general formula [2] includes the straight chained or branched alkyl group having 1 to 4 carbon atoms and having 1 or 2 phosphonic acid groups, specifically, for example, a (mono)phosphonomethyl group, a (mono)phosphonoethyl group, a (mono)phosphono-n-propyl group, a (mono)phosphonoisopropyl group, a (mono)phosphono-n-butyl group, a (mono)phosphonoisobutyl group, a (mono)phosphono-s-butyl group, a (mono)phosphono-t-butyl group, a diphosphonomethyl group, a diphosphonoethyl group, a diphosphono-n-propyl group, a diphosphonoisopropyl group, a diphosphono-n-butyl group, a diphosphonoisobutyl group, a diphosphono-s-butyl group, a diphosphono-t-butyl group, and the like, and among them, a (mono)phosphonomethyl group, a (mono)phosphonoethyl group which are alkyl groups having 1 to 2 carbon atoms and having one phosphonic acid group are preferable, and among them, a (mono)phosphonomethyl group which is an alkyl groups having one carbon atom and having one phosphonic acid group is preferable. It should be noted that, in the above-described specific examples, n—means normal type, s—means sec-type, and t—means tert-type.

As $Z^1$ to $Z^5$ in the general formula [2], it is preferable that all of $Z^1$ to $Z^4$ and n pieces of $Z^5$ are alkyl groups having a phosphonic acid group.

A specific example of (B) phosphonic acid-based chelating agent having a nitrogen atom in the structure includes, a phosphonic acid-based chelating agent represented by the general formula [1], for example, ethylaminobis(methylenephosphonic acid), dodecylaminobis(methylenephosphonic acid), nitrilotris(methylenephosphonic acid) [NTPO], ethylenediamine bis(methylenephosphonic acid) [EDDPO], propanediamine bis(methylenephosphonic acid) [1,2-propylenediamine bis(methylenephosphonic acid), 1,3-propylenediamine bis(methylenephosphonic acid)], ethylenediamine tetra(methylenephosphonic acid) [EDTPO], ethylenediamine tetra(ethylenephosphonic acid), propanediamine tetra(methylenephosphonic acid) [PDTMP] [1,2-propylenediamine tetra(methylenephosphonic acid), 1,3-propylenediamine tetra(methylenephosphonic acid)], 1,6-hexamethylenediamine tetra(methylenephosphonic acid), and the like; a phosphonic acid-based chelating agent represented by the general formula [2], for example, diethylenetriamine penta(methylenephosphonic acid) [DEPPO], diethylenetriamine penta(ethylenephosphonic acid), triethylenetetramine hexa(methylenephosphonic acid), triethylenetetramine hexa(ethylenephosphonic acid), and the like, and among them, nitrilotris(methylenephosphonic acid) [NTPO], ethylenediamine tetra(methylenephosphonic acid) [EDTPO], diethylenetriamine penta(methylenephosphonic acid) [DEPPO] are preferable, and among them, nitrilotris (methylenephosphonic acid) [NTPO], diethylenetriamine penta(methylenephosphonic acid) [DEPPO] are more preferable, and still more among them, nitrilotris(methylenephosphonic acid) [NTPO] is particularly preferable. These preferable phosphonic acid-based chelating agents are preferable chelating agents in view of having higher decomposition suppression effect of hydrogen peroxide, as compared with other phosphonic acid-based chelating agents. It should be noted that these phosphonic acid-based chelating agents may be used alone as one kind of phosphonic acid-based chelating agent, or two or more kinds of phosphonic acid-based chelating agents may be used in combination. In addition, as these phosphonic acid-based chelating agents, a salt of phosphonic acid, for example, an alkali metal salt of phosphonic acid, or a derivative of phosphonic acid, for example, an ester of phosphonic acid may also be used. As these phosphonic acid-based chelating agents, commercially available ones may be used, or those synthesized as appropriate by a known method per se may also be used, and the commercially available phosphonic acid-based chelating agents include those containing water, such as, for example, purified water such as distilled water, deionized water, ultra-pure water, other than the phosphonic acid-based chelating agents, and such phosphonic acid-based chelating agents containing water may also be used without any troubles.

(C) alkali metal hydroxide is used aiming at adjusting and maintaining a pH of the etching agent of the present invention within a desired range, as well as dissolving a Ti-based metal oxidized by hydrogen peroxide. Such an alkali metal hydroxide includes, for example, lithium hydroxide, sodium hydroxide, potassium hydroxide, rubidium hydroxide, cesium hydroxide, and the like, and among them, lithium hydroxide, sodium hydroxide, potassium hydroxide are preferable, and still more among them, lithium hydroxide, sodium hydroxide are more preferable. These preferable alkali metal hydroxides are preferable alkali metal hydroxides, in view of having not only high etching rate of a Ti-based metal, relative to a metallic copper or a copper alloy (having higher dissolution speed ratio of Ti/Cu), as compared with other alkali metal hydroxide, but also having higher decomposition suppression effect of hydrogen peroxide. It should be noted that these alkali metal hydroxides may be used alone as one kind of alkali metal hydroxide, or two or more kinds of alkali metal hydroxides may be used in combination. In addition, as these alkali metal hydroxides, commercially available ones may be used.

(D) organic acid having at least one hydroxyl group and at least three carboxyl groups is used aiming at suppressing elution of copper from a metallic copper or a copper alloy. That is, the organic acid having at least one hydroxyl group and at least three carboxyl groups is used as a copper anticorrosive. Such an organic acid having at least one hydroxyl group and at least three carboxyl groups includes, for example, citric acid, and the like. It should be noted that these organic acids may be used alone as one kind of organic acid, or two or more kinds of organic acids may be used in combination. In addition, as these organic acids, commercially available ones may be used.

The etching agent of the present invention is an etching agent containing water, because of comprising an aqueous solution. Water is not especially limited, as long it is the one not giving adverse influence on a semiconductor substrate, in a manufacturing process of a semiconductor device. A specific example of water includes, for example, purified water such as distilled water, deionized water, ultra-pure water, and the like, and among them, ultra-pure water is preferable. Ultra-pure water is preferable water in view of containing little impurities, and giving little adverse influence on the semiconductor substrate in the manufacturing process of the semiconductor device.

In the etching agent of the present invention, (E) pH adjusting agent, (F) surfactant or the like may be contained as other components, as needed, other than (A), (B), (C) and (D), which are structural components.

(E) pH adjusting agent may be added as appropriate, in view of being able to adjust and maintain a pH of the etching agent of the present invention to the desired range. Such (E) pH adjusting agent includes, for example, an inorganic acid, such as, for example, hydrochloric acid, nitric acid, phosphoric acid, boric acid, hydrofluoric acid, and carbonic acid. It should be noted that these pH adjusting agents may be used alone as one kind of pH adjusting agent, or two or more kinds of pH adjusting agents may be used in combination. In addition, as these pH adjusting agents, commercially available ones may be used.

(F) Surfactant may be added as appropriate, in view of being able to improve wettability of the etching agent of the present invention onto the surface of a semiconductor substrate. Such (E) surfactant includes, for example, a cationic surfactant, an anionic surfactant, a nonionic surfactant, an amphoteric surfactant, and the like. A specific example of the cationic surfactant includes a primary to tertiary alkyl amine salt, such as, for example, monostearylammonium chloride, distearylammonium chloride, tristearylammonium chloride; a modified aliphatic polyamine, such as, for example, polyethylene polyamine. A specific example of the anionic surfactant includes an anionic surfactant having a carboxyl group in a molecule, such as, for example, a sodium alkyl carboxylate, a potassium alkyl carboxylate, an ammonium alkyl carboxylate, a sodium alkylbenzene carboxylate, a potassium alkylbenzene carboxylate, an ammonium alkylbenzene carboxylate, a sodium polyoxyalkylene alkylether carboxylate, a potassium polyoxyalkylene alkylether carboxylate, an ammonium polyoxyalkylene alkylether carboxylate, a sodium N-acyl sarcosinate, a potassium N-acyl sarcosinate, an ammonium N-acyl sarcosinate, a sodium N-acyl glutamate, a potassium N-acyl glutamate, an ammonium N-acyl glutamate; an anionic surfactant having a sulfonic acid group in a molecule, such as, for example, a sodium alkyl sulfonate, a potassium alkyl sulfonate, an ammonium alkyl sulfonate; an alkylbenzene sulfonic acid, such as, for example, dodecylbenzene sulfonic acid; a sodium alkylbenzene sulfonate, such as, for example, sodium dodecylbenzene sulfonate; a potassium alkylbenzene sulfonate, such as, for example, potassium dodecylbenzene sulfonate; an ammonium alkylbenzene sulfonate, such as, for example, ammonium dodecylbenzene sulfonate; a sodium alkylnaphthalene sulfonate, a potassium alkylnaphthalene sulfonate, an ammonium alkylnaphthalene sulfonate, a sodium polyoxyalkylene alkylether sulfonate, a potassium polyoxyalkylene alkylether sulfonate, an ammonium polyoxyalkylene alkylether sulfonate, a N-methyl-N-acyltaurine sodium salt, a N-methyl-N-acyltaurine potassium salt, a N-methyl-N-acyltaurine ammonium salt; a dialkyl sulfosuccinate sodium salt, such as, for example, dioctyl sulfosuccinate sodium salt; a dialkyl sulfosuccinate potassium salt, such as, for example, dioctyl sulfosuccinate potassium salt; a dialkyl sulfosuccinate ammonium salt, such as, for example, dioctyl sulfosuccinate ammonium salt; an anionic surfactant having a sulfate ester in a molecule, such as, for example, a sodium alkyl sulfate, such as, for example, sodium lauryl sulfate; a potassium alkyl sulfate, such as, for example, potassium lauryl sulfate; an ammonium alkyl sulfate, such as, for example, ammonium lauryl sulfate; an anionic surfactant having a phosphonic acid group in a molecule, such as, for example, a sodium alkyl phosphonate, a potassium alkyl phosphonate, an ammonium alkyl phosphonate, a sodium alkylbenzene phosphonate, a potassium alkylbenzene phosphonate, an ammonium alkylbenzene phosphonate, a sodium polyoxyalkylene alkylether phosphonate, a potassium polyoxyalkylene alkylether phosphonate, an ammonium polyoxyalkylene alkylether phosphonate. A specific example of a nonionic surfactant includes, for example, a polyoxyethylene alkylether such as, for example, polyoxyethylene stearyl ether; a polyoxyethylene alkenyl ether, such as, for example, polyoxyethylene oleyl ether; a polyoxyalkylene alkylphenyl ether, such as, for example, polyoxyethylene nonylphenyl ether; a polyoxyalkylene glycol, such as, for example, polyoxypropylene polyoxyethylene glycol; a polyoxyethylene monoalkylate, such as, for example, polyoxyethylene monostearate; a bispolyoxyethylene alkylamine, such as, for example, bispolyoxyethylene stearylamine; a bispolyoxyethylene alkylamide, such as, for example, bispolyoxyethylene stearylamide; an alkylamine oxide, such as, for example, N,N-dimethylalkylamine oxide; and the like. A specific example of an amphoteric surfactant includes, for example, a carboxy betaine, such as, for example, an alkyl-N,N-dimethylamino acetate betaine, an alkyl-N,N-dihydroxyethylamino acetate betaine; a sulfo betaine, such as, for example, an alkyl-N,N-dimethylsulfoethylene ammonium betaine; imidazolinium betaine, such as, for example, a 2-alkyl-N-carboxymethyl-N-hydroxyethylimidazolinium betaine; and the like. It should be noted that these surfactants may be used alone as one kind of surfactant, or two or more kinds of surfactants may be used in combination. In addition, as these surfactants, commercially available ones may be used.

There may be the case where the etching agent of the present invention not containing components other than the above-described (A), (B), (C) and (D) is desirable, in view of being capable of etching a Ti-base metal without giving adverse influence on parts configuring a semiconductor device. It should be noted that "not containing other components (consisting of (A), (B), (C) and (D))" means not containing other components in certain amount or more which could give adverse influence on the above-described parts. That is, it never excludes the etching agent containing trace amount of other components (admixing of trace amount of other components), and means that other components are not contained substantially.

It is desirable that (A) hydrogen peroxide, (B) phosphonic acid-based chelating agent having a nitrogen atom in the structure, (C) alkali metal hydroxide, and (D) organic acid having at least one hydroxyl group and at least three carboxyl groups, as well as (E) pH adjusting agent and (F) surfactant, which are auxiliary components of the etching agent of the present invention are adjusted to weight % concentration shown below.

A weight % concentration of (A) hydrogen peroxide is usually 10 to 33% by weight, and preferably 10 to 30% by weight, as weight % of (A), relative to total weight of the etching agent. When the weight % concentration of (A) is below 10% by weight, an etching speed of a Ti-based metal could be slowed down significantly. When the weight % concentration of (A) is over 33% by weight, hydrogen peroxide is decomposed caused by copper (copper oxide) eluted from a metallic copper or a copper alloy, and abnormal heating could be caused by decomposition of hydrogen peroxide.

A weight % concentration of (B) phosphonic acid-based chelating agent having a nitrogen atom in the structure is usually 0.05 to 5% by weight, preferably 0.05 to 3% by weight, and more preferably 0.1 to 3% by weight, as weight % of (B), relative to total weight of the etching agent. When the weight % concentration of (B) is below 0.05% by weight, copper (copper oxide) eluted from a metallic copper or a copper alloy cannot be captured (insufficient chelating), and hydrogen peroxide is decomposed caused by copper (copper oxide) not captured (insufficiently chelating), and abnormal heating could be caused by decomposition of hydrogen peroxide. When the weight % concentration of (B) is over 5% by weight, a selectivity of a Ti-based metal, which is an etching subject, could be decreased.

A weight % concentration of (C) alkali metal hydroxide is usually 0.2 to 5% by weight, preferably 0.2 to 4% by weight, and more preferably 0.3 to 4% by weight, as weight % of (C), relative to total weight of the etching agent. When the weight % concentration of (C) is below 0.2% by weight, an etching speed of a Ti-based metal could be slowed down. When the weight % concentration of (C) is over 5% by weight, self-decomposition of hydrogen peroxide is induced, and abnormal heating could be caused by self-decomposition of hydrogen peroxide.

A weight % concentration of (D) organic acid having at least one hydroxyl group and at least three carboxyl groups is usually 0.01 to 5% by weight, preferably 0.03 to 3% by weight, and more preferably 0.04 to 1% by weight, as % by weight of (D), relative to total weight of the etching agent. When the weight % concentration of (D) is below 0.01% by weight, copper from a metallic copper or a copper alloy could tend to be easily eluted. When the weight % concentration of (D) is over 5% by weight, a selectivity of a Ti-based metal, which is an etching subject, could be decreased.

A weight % concentration of (E) pH adjusting agent is usually 0.05 to 4% by weight, and preferably 0.2 to 3% by weight, as % by weight of (E), relative to total weight of the etching agent. When the weight % concentration of (E) is over 4% by weight, an etching speed of a Ti-based metal could be slowed down.

A weight % concentration of (F) surfactant is usually 0.001 to 1% by weight, and preferably 0.01 to 0.5% by weight, as % by weight of (F), relative to total weight of the etching agent. When the weight % concentration of (F) is over 1% by weight, an etching speed of a Ti-based metal could be slowed down.

The etching agent of the present invention comprises a neutral or alkaline aqueous solution, and among them, it is preferable to comprise an aqueous solution having a pH of 7 to 10, and still more among them it is preferable to comprise an aqueous solution having a pH of 7.5 to 9.5, and it is particularly preferable to comprise an aqueous solution having a pH of over 8.0 to 9.5 or lower. When a pH of the aqueous solution is below 7, an etching speed of a Ti-based metal could be slowed down, or chelating capability of (B) phosphonic acid-based chelating agent having a nitrogen atom in the structure could be slowed down, or a selectivity of a Ti-based metal, which is an etching subject, could be decreased. When a pH of the aqueous solution is over 10, self-decomposition of hydrogen peroxide is induced, and abnormal heating could be caused by self-decomposition of hydrogen peroxide, or a selectivity of a Ti-based metal, which is an etching subject, could be decreased, or it could corrode a semiconductor parts such as a silicon (Si) substrate to be described later. In addition, by adjusting the pH of the etching agent of the present invention within such a preferable range, an etching rate by the etching agent can be adjusted to a desired rate, and a semiconductor substrate, where only a Ti-based metal is etched and a metallic copper or a copper alloy is little etched, can be obtained stably. It should be noted that a pH adjustment may be carried out by adjusting mainly contained amount of (C) alkali metal hydroxide.

A pH of the etching agent of the present invention is measured without dilution, using a commercially available pH meter, in accordance with JIS A preparation method itself of the etching agent of the present invention is not especially limited, as long as the method is capable of preparing an aqueous solution containing (A) hydrogen peroxide, (B) phosphonic acid-based chelating agent having a nitrogen atom in the structure, (C) alkali metal hydroxide, and (D) organic acid having at least one hydroxyl group and at least three carboxyl groups, as well as (E) pH adjusting agent and (F) surfactant, if necessary. A specific example of the preparation method includes a method for adding (F) surfactant, if necessary, after adding (B) phosphonic acid-based chelating agent having a nitrogen atom in the structure, (C) alkali metal hydroxide and (D) organic acid having at least one hydroxyl group and at least three carboxyl groups to, for example, ultra-pure water, and still more adding (E) pH adjusting agent, if necessary, to adjust a pH, and then prepare a uniform aqueous solution by stirring, or the like. The etching agent of the present invention prepared in this way may be subjected to filtration treatment, or the like before use.

A stirring and mixing apparatus to be used in preparing the etching agent of the present invention includes, for example, a stirring apparatus, a dispersing machine, or the like. The stirring apparatus includes, for example, a mechanical stirrer, a magnetic stirrer, or the like. In addition, the dispersing machine includes, for example, a homogenizer, an ultrasonic dispersing machine, a ball mill, beads mill, or the like.

—An Etching Method of the Present Invention—

The etching method of the present invention is a method, characterized by carrying out selective etching of a titanium-based metal on the semiconductor substrate, having a titanium-based metal and a metallic copper or a copper alloy on the upper part of the titanium-based metal, using the etching agent, which comprises an aqueous solution containing (A) hydrogen peroxide, (B) phosphonic acid-based chelating agent having a nitrogen atom in the structure, (C) alkali metal hydroxide and (D) organic acid having at least one hydroxyl group and at least three carboxyl groups. That is, the etching method of the present invention is a method, characterized by using the etching agent of the present invention, and the etching method itself is not especially limited.

As a specific example of the etching method of the present invention, firstly, the etching agent of the present invention is prepared, in which concentrations are adjusted so as to attain a predetermined range by the above-described preparation method. Next, a Ti-based metal can be selectively etched, for example, by immersing a Ti-based metal and a semiconductor substrate, having a Ti-based metal and a metallic copper or a copper alloy on the upper part of the Ti-based metal into the etching agent of the present invention. It should be noted that an etching pattern is not limited to the immersion pattern, and a spinning (dropping) pattern for dropping the etching agent of the present invention while rotating the semiconductor substrate, a spray pattern for spraying the etching agent of the present invention, or the like, which is usually carried out in this field, may be adopted as appropriate, other than the immersion pattern.

As a processing system of the semiconductor substrate in the etching method of the present invention, any of single wafer processing and batch wafer processing may be adopted. The single wafer processing is a processing, which is generally said as a method for processing a semiconductor substrate piece by piece, and the batch wafer processing is a processing, which is generally said as a method for processing a plurality of the semiconductor substrates at the same time.

An etching temperature in the etching method of the present invention is not especially limited, as long it is such etching temperature as is usually carried out in this field. Specific example of the etching temperature is, for example, 10 to 50° C.

An etching time in the etching method of the present invention cannot be said unconditionally, because it depends on shape or thickness of a Ti-based metal, which is an etching subject, however, it is practically, for example, usually 30 seconds to 1 hour, preferably 1 to 30 minutes, and more preferably 1 to 10 minutes.

—An Etching Agent Preparation Liquid of the Present Invention—

The etching agent preparation liquid of the present invention comprises an aqueous solution containing at least (B) phosphonic acid-based chelating agent having a nitrogen atom in the structure, (C) alkali metal hydroxide and (D) organic acid having at least one hydroxyl group and at least three carboxyl groups, and is a preparation liquid to be mixed with a solution containing (A) hydrogen peroxide, and is a preparation liquid for preparing the etching agent for a titanium-based metal on a semiconductor substrate, having a titanium-based metal and a metallic copper or a copper alloy arranged on the upper part of the titanium-based metal.

That is, the etching agent preparation liquid of the present invention comprises the aqueous solution to be used for preparing the etching agent of the present invention by mixing with a solution containing (A) hydrogen peroxide, and refers to an aqueous solution containing the one other than an aqueous solution containing (A) hydrogen peroxide, in the case of being supplied in a two-liquid system, as supply aspect of the etching agent of the present invention.

In this way, by supplying the etching agent of the present invention by the two-liquid system of the solution containing (A) hydrogen peroxide, and the etching agent preparation liquid, which comprises an aqueous solution containing at least (B) phosphonic acid-based chelating agent having a nitrogen atom in the structure, (C) alkali metal hydroxide and (D) organic acid having at least one hydroxyl group and at least three carboxyl groups, and mixing these to make the etching agent of the present invention, in using the etching agent of the present invention, decomposition of hydrogen peroxide can be suppressed still more, and a life-time of the etching agent can be extended still more. Therefore, it is desirable that mixing of the etching agent preparation liquid of the present invention and the solution containing (A) hydrogen peroxide is carried out just before use of the etching agent of the present invention.

A weight % concentration of each structural component of (B) phosphonic acid-based chelating agent having a nitrogen atom in the structure, (C) alkali metal hydroxide and (D) organic acid having at least one hydroxyl group and at least three carboxyl groups, in the etching agent preparation liquid of the present invention, is not especially limited, as long as weight % concentration of each structural component of (B), (C) and (D) attains the above-described weight % concentration, in making the etching agent of the present invention by mixing with the solution containing (A) hydrogen peroxide, and, for example, the etching agent of the present invention may be prepared by preparing the etching agent preparation liquid containing each component which concentration weight % is adjusted in a range to be shown below, and mixing this with a solution containing (A) hydrogen peroxide.

A weight % concentration of (B) phosphonic acid-based chelating agent having a nitrogen atom in the structure, in the etching agent preparation liquid of the present invention, is usually 1 to 10% by weight, preferably 1 to 8% by weight, and more preferably 2 to 6% by weight, as weight % of (B) relative to total weight of the etching agent preparation liquid.

A weight % concentration of (C) alkali metal hydroxide, in the etching agent preparation liquid of the present invention, is usually 4 to 10% by weight, preferably 5 to 10% by weight, and more preferably 6 to 10% by weight, as weight % of (C) relative to total weight of the etching agent preparation liquid.

A weight % concentration of (D) organic acid having at least one hydroxyl group and at least three carboxyl groups, in the etching agent preparation liquid of the present invention, is usually 0.2 to 10% by weight, preferably 0.2 to 8% by weight, and more preferably 0.4 to 6% by weight, as % by weight of (D) relative to total weight of the etching agent preparation liquid.

In the etching agent preparation liquid of the present invention, (E) pH adjusting agent, (F) surfactant, and the like may be contained, as needed, as other components, other than (B), (C) and (D), which are structural components. A weight % concentration of these, in the etching agent preparation liquid of the present invention, is not especially limited, as long as the weight % concentration of each component (E) and (F) attains the above-described weight % concentration, when the etching agent of the present invention is prepared by mixing with a solution containing (A) hydrogen peroxide.

The etching agent preparation liquid containing (B), (C) and (D) as well as each component of (E) and (F), as needed, in which concentrations are adjusted to such weight % concentration, may be mixed with a solution containing (A) hydrogen peroxide, having usually 20 to 35% by weight, preferably 20 to 30% by weight, and more preferably 25 to 30% by weight.

A mixing ratio of a solution (first liquid) containing (A) hydrogen peroxide and the etching agent preparation liquid (second liquid) of the present invention [the first liquid:the second liquid] is usually 50:50 to 95:5, preferably 60:40 to 90:10, and more preferably 70:30 to 80:20, on weight ratio basis.

As a mixing method for a solution containing (A) hydrogen peroxide and the etching agent preparation liquid of the present invention, that is, a preparation method for the etching agent of the present invention by preparing from the solution containing (A) hydrogen peroxide and the etching agent preparation liquid of the present invention, the above-described preparation method may be adopted as appropriate, and also as a stirring and mixing apparatus to be used in the preparation, the above-described stirring and mixing apparatus may be used.

A pH of a solution containing (A) hydrogen peroxide and a pH of the etching agent preparation liquid of the present invention are not especially limited, as long as a pH in mixing these solutions, that is, a pH in preparing the etching agent of the present invention by mixing these, attains the above-described pH. In other word, a pH of the solution containing (A) hydrogen peroxide and a pH of the etching agent preparation liquid of the present invention may be adjusted so as to attain the etching agent of the present invention having a pH of usually neutral or alkaline, preferably 7 to 10, more preferably 7.5 to 9.5, and still more preferably over 8.0 and 9.5 or lower, in mixing the solution containing (A) hydrogen peroxide and the etching agent preparation liquid of the present invention.

There is no problem that the etching agent preparation liquid of the present invention increases a weight % concentration of each structural components (B), (C) and (D), for example, to 10 times to 100 times higher concentration of the above-described weight % concentration, to make volume as small as possible in non-use time such as in storage, distribution. The etching agent preparation liquid of the present invention having such a high concentration component can be used by diluting with water, or the like. as appropriate, in preparation etc.

—A Semiconductor Substrate Relating to the Present Invention—

The semiconductor substrate relating to the present invention is a semiconductor substrate having at least Ti-based metal on the upper part of a wafer configuring a semiconductor substrate, and still more having a metallic copper or a copper alloy on the upper part of the Ti-based metal. A specific example of the wafer configuring the semiconductor substrate includes a wafer composed of a silicon-based material, such as, for example, a silicon (Si) wafer, a silicon carbide (SiC) wafer, a resin-based wafer (glass epoxy wafer) containing silicon, a gallium phosphorus (GaP) wafer, a gallium arsenic (GaAs) wafer, an indium phosphorus (InP) wafer, or the like. In addition, the silicon (Si) wafer may be an n-type silicon (Si) wafer doped with a pentavalent atom, such as, for example, phosphorus (P), arsenic (As), antimony (Sb), on the silicon (Si) wafer; a p-type silicon (Si) wafer doped with a trivalent atom, such as, for example, boron (B), gallium (Ga), on the silicon (Si) wafer. It should be noted that silicon (Si) of the silicon (Si) wafer may be, for example, any of an amorphous silicon, a single crystal silicon, a polycrystalline silicon, or a polysilicon. Among these wafers, the etching agent and the etching method of the present invention are suitably used to a wafer composed of a silicon-based material such as a silicon (Si) wafer, a silicon carbide (SiC) wafer, a resin-based wafer (glass epoxy wafer) containing silicon.

The semiconductor substrate relating to the present invention may have an insulating film on the upper part of the above-described wafer. A specific example of the insulating film includes, a silicon oxide film, such as, for example, a silicon dioxide ($SiO_2$) film, a tetraethyl orthosilicate $Si(OC_2H_5)_4$ film [TEOS film]; a silicon nitride film, such as, for example, silicon nitride ($Si_3N_4$), silicon nitride carbide (SiNC); for example, a low dielectric constant (Low-k) film [SiOC film, SiC film, or the like], or the like.

The semiconductor substrate relating to the present invention is a substrate having at least Ti-based metal, and the Ti-based metal may be a metal composed of only a Ti metal, or may be an alloy composed of a Ti metal and other metals (Ti-based alloy), as described above. The Ti-based alloy referred to here is an alloy containing Ti as a main component, and includes an alloy composed of one or more kinds of metals selected from, for example, tungsten (W), nickel (Ni), aluminum (Al), or the like, and Ti. A specific example of such an alloy includes, for example, a titanium-tungsten alloy (TiW alloy), a titanium-nickel alloy (TiNi alloy), a titanium-aluminum alloy (a TiAl alloy), or the like. The etching agent and the etching method of the present invention are suitably used to a metallic titanium, or a titanium-tungsten alloy (TiW alloy).

The Ti-based metal relating to the present invention is a metal configuring a barrier metal, an adhesive layer, or the like, in the semiconductor substrate relating to the present invention.

The semiconductor substrate relating to the present invention is a substrate having a metallic copper or a copper, alloy on the upper part of the titanium-based metal, and the metallic copper or the copper alloy is a metal configuring an adhesive layer, a wiring or a bump, or the like.

When the metallic copper or the copper alloy relating to the present invention is a copper wiring or a copper alloy wiring, the copper alloy wiring referred to here is a copper alloy wiring containing copper as a main component, and includes, the copper alloy wiring composed of one or more kinds of metals selected from, for example, magnesium (Mg), manganese (Mn), nickel (Ni), or the like, and copper. A specific example of such a copper alloy wiring includes, for example, a copper-magnesium alloy wiring (CuMg alloy wiring), a copper-manganese alloy wiring (CuMn alloy wiring), a copper-nickel alloy wiring (CuNi alloy wiring), or the like.

When the Ti-based metal relating to the present invention is an adhesive layer, the semiconductor substrate relating to the present invention may have a barrier metal composed of a metal other than the Ti-based metal. A specific example of the barrier metal includes, for example, tantalum (Ta), tantalum nitride (Ta), or the like.

The semiconductor substrate relating to the present invention may have a lead (Pb)-free solder bump. A metal configuring the lead (Pb)-free solder bump referred to here includes the one composed of a metal selected from, for example, copper (Cu), tin (Sn), aluminum (Al), nickel (Ni), zinc (Zn), silver (Ag), gold (Au), indium (In), antimony (Sb), bismuth (Bi), or the like. When the lead (Pb)-free solder bump is a bump composed of the metallic copper or the copper alloy, a metal configuring the bump includes a bump composed of copper, or a copper alloy bump composed of one or more kinds of metals selected from tin (Sn), and copper. A specific example of such a copper alloy bump include, for example, a copper-tin alloy bump (CuSn alloy bump), or the like.

In the case where the semiconductor substrate relating to the present invention has a bump composed of the metallic copper or the copper alloy, a wiring may be the one composed of a metal other than the metallic copper or the copper alloy. A metal configuring the wiring includes, for example, aluminum (Al), gold (Au), or the like. A specific example of such the wiring includes, for example, an aluminum (Al) wiring, a gold (Au) wiring, or the like.

In the case where the semiconductor substrate relating to the present invention has a lead (Pb)-free solder bump, the semiconductor substrate may have, between them, a conductor-adhesive parts composed of a metal such as nickel (Ni), palladium (Pd), copper (Cu), to enhance adhesive properties between the above-described metal wiring and the bump.

A method for forming the above-described barrier metal, adhesive layer, metal wiring, lead (Pb)-free solder bump, conductor-adhesive parts is not especially limited, as long as it is a method usually carried out in this field, and specifically, for example, the barrier metal, the adhesive layer, the metal wiring, the lead (Pb)-free solder bump, the conductor-adhesive parts may be formed by adopting plating or chemical vapor deposition, after forming a circuit by a resist, or the like, on the wafer configuring the semiconductor substrate relating to the present invention.

EXAMPLES

Explanation on the present invention will be given specifically below based on Examples and Comparative Examples, however, the present invention should not be limited to these Examples. It should be noted that "%" in the following examples is weight basis (w/w) %, unless otherwise specified.

Example 1: Preparation of the Etching Agent of the Present Invention-1

Hydrogen peroxide (produced by Wako Pure Chemical Industries, Ltd.), diethylenetriamine penta(methylenephosphonic acid) 7-sodium salt (32% aqueous solution) (produced by Italmatch Japan Ltd.), potassium hydroxide (produced by Wako Pure Chemical Industries, Ltd.) and citric acid (produced by KOMATSUYA Corp.) were added into ultra pure water, so as to attain weight % shown in Table 1, stirred as appropriate to obtain the etching agent of the present invention. The obtained etching agent had a pH of 9.0. The etching agent was referred to as an etching agent 1.

Comparative Example 1: Preparation of Comparative Etching Agent-1

Hydrogen peroxide (produced by Wako Pure Chemical Industries, Ltd.), 1-hydroxyethane-1,1-bis(phosphonic acid) (60% aqueous solution) (produced by Wako Pure Chemical Industries, Ltd.), potassium hydroxide (produced by Wako Pure Chemical Industries, Ltd.) and citric acid (produced by KOMATSUYA Corp.) were added into ultra pure water, so as to attain weight % in Table 1, stirred as appropriate to obtain the comparative etching agent. The obtained etching agent had a pH of 9.0. The etching agent was referred to as an etching agent 2.

Comparative Example 2: Preparation of Comparative Etching Agent-2

Hydrogen peroxide (produced by Wako Pure Chemical Industries, Ltd.), ethylenediamine tetraacetic acid (produced by Wako Pure Chemical Industries, Ltd.), potassium hydroxide (produced by Wako Pure Chemical Industries, Ltd.) and citric acid (produced by KOMATSUYA Corp.) were added into ultra pure water, so as to attain weight % shown in Table 1, stirred as appropriate to obtain the comparative etching agent. The obtained etching agent had a pH of 9.0. The etching agent was referred to as an etching agent 3.

Compositions (components and weight %) of the etching agents of Example 1 and Comparative Examples 1 to 2 are shown in Table 1.

TABLE 1

|  | Example 1 Etching agent 1 | Comparative Example 1 Etching agent 2 | Comparative Example 2 Etching agent 3 |
|---|---|---|---|
| Hydrogen peroxide (wt. %) | 24.5 | 24.5 | 24.5 |
| Chelating agent (wt. %) | DEPPO 1.5 | HEDPO 1.5 | EDTA 1.5 |
| Potassium hydroxide (wt. %) | 3.0 | 3.0 | 3.0 |
| Citric acid (wt. %) | 0.1 | 0.1 | 0.1 |
| Water (wt. %) | 70.9 | 70.9 | 70.9 |

DEPPO: diethylenetriamine penta(methylenephosphonic acid)
HEDPO: 1-hydroxyethane-1,1-bis(phosphonic acid)
EDTA: ethylenediamine tetraacetic acid Experimental Examples 1 to 3: Immersion Tests of the Etching Agents 1 to 3

Each of the etching agents, obtained in Example 1 and Comparative Examples 1 to 2, was put into a container made of polypropylene, and each one piece of a titanium plate (manufactured by Rare Metallic Co., Ltd.) with a size of 1 cm×2 cm, and a copper plate (manufactured by Rare Metallic Co., Ltd.) with a size of 2 cm×2 cm was immersed into the etching agent heated at 40° C., for 300 minutes simultaneously. During the etching, each 100 μL of samples was taken at a predetermined time interval (30, 60, 180 and 300 minutes), for metal contained amount analysis and hydrogen peroxide analysis, respectively.

Each etching agent sampled for metal contained amount analysis was diluted to 100 times using a 1% nitric acid aqueous solution, to measure contained amounts of a metallic titanium and a metallic copper, using a plasma emission spectrophotometer (apparatus name: ICP-AES SPS-3100; manufactured by SII Co., Ltd.). From the results of the contained amounts measured, dissolution amounts of the metallic titanium and the metallic copper per unit area of the titanium plate and the copper plate, and etching rates of titanium and copper were calculated. The results are shown in Table 2.

In addition, each etching agent sampled for hydrogen peroxide analysis was diluted in measuring cylinder to 10 mL total, using a 0.5 N sulfuric acid aqueous solution, to calculate contained amount of hydrogen peroxide using a redox titration method by 0.02 mol/L potassium permanganate. The results are shown in Table 3.

It should be noted that these Experimental Examples are experiments, where the titanium plate and the copper plate were continuously immersed each one piece by one piece for 300 minutes at the longest, and the Experimental Examples are model experiments on the assumption of a continuous immersion method of plurality pieces of semiconductor substrates, in practical use of the etching agent, to compare an etching rate and a decomposition ratio of hydrogen peroxide, in the case of continuous use of the same etching agent, by etching plurality pieces of semiconductor substrates for 300 minutes at the longest.

TABLE 2

|  | Experimental Example 1 Etching agent 1 | | Experimental Example 2 Etching agent 2 | | Experimental Example 3 Etching agent 3 | |
|---|---|---|---|---|---|---|
| Time (min.) | Ti E/R (nm/min.) | Cu E/R (nm/min.) | Ti E/R (nm/min.) | Cu E/R (nm/min.) | Ti E/R (nm/min.) | Cu E/R (nm/min.) |
| 30 | 158 | 1.8 | 120 | 1.3 | 165 | 0.4 |
| 60 | 145 | 1.2 | 128 | 1.3 | 164 | 0.4 |
| 180 | 149 | 1.0 | 141 | 1.2 | 180 | 0.5 |
| 300 | 138 | 1.1 | 135 | 1.0 | 177 | 0.5 |
| Average value | 148 | 1.3 | 131 | 1.2 | 172 | 0.5 |
| Ti/Cu Dissolution speed ratio | 114 | | 109 | | 344 | |

TABLE 3

|  | Experimental Example 1 Etching agent 1 | | Experimental Example 2 Etching agent 2 | | Experimental Example 3 Etching agent 3 | |
|---|---|---|---|---|---|---|
| Time (min.) | $H_2O_2$ amount (%) | $H_2O_2$ decomposition ratio (%) | $H_2O_2$ amount (%) | $H_2O_2$ decomposition ratio (%) | $H_2O_2$ amount (%) | $H_2O_2$ decomposition ratio (%) |
| 0 | 24.5 | 0.0 | 24.5 | 0.0 | 24.5 | 0.0 |
| 30 | 24.2 | 1.2 | 24.2 | 1.1 | 24.3 | 0.8 |
| 60 | 24.0 | 1.8 | 23.6 | 3.8 | 23.3 | 4.9 |

TABLE 3-continued

| | Experimental Example 1 Etching agent 1 | | Experimental Example 2 Etching agent 2 | | Experimental Example 3 Etching agent 3 | |
|---|---|---|---|---|---|---|
| Time (min.) | $H_2O_2$ amount (%) | $H_2O_2$ decomposition ratio (%) | $H_2O_2$ amount (%) | $H_2O_2$ decomposition ratio (%) | $H_2O_2$ amount (%) | $H_2O_2$ decomposition ratio (%) |
| 180 | 23.1 | 5.5 | 16.0 | 34.6 | 18.4 | 25.0 |
| 300 | 20.8 | 14.8 | 8.4 | 65.6 | 13.3 | 45.5 |

$H_2O_2$ decomposition ratio: (($H_2O_2$ amount (%) at etching 0 min − $H_2O_2$ amount (%) at each time)/$H_2O_2$ amount (%) at etching 0 min) × 100

As is clear from the results of Experimental Examples 1 to 3, it was found that the etching agent (etching agent 1) of the present invention has not only high dissolution speed ratio of Ti/Cu, but also the lowest decomposition ratio, 14.8%, of hydrogen peroxide after 300 minutes from initiation of etching, as compared with other etching agents (etching agent 2 and etching agent 3), and decomposition of hydrogen peroxide is suppressed most (Experimental Example 1). On the contrary, it was found that the etching agent (etching agent 2) of Comparative Example 1 has very high decomposition ratio of hydrogen peroxide, and thus decomposes about 70% of hydrogen peroxide, after 300 minutes from initiation of etching, although it has nearly the same degree of dissolution speed ratio of Ti/Cu as the etching agent of the present invention (Experimental Example 2). In addition, it was found that the etching agent (etching agent 3) of Comparative Example 2 has high decomposition ratio of hydrogen peroxide, and thus decomposes about 50% of hydrogen peroxide, after 300 minutes from initiation of etching, although it is the one having higher dissolution speed ratio of Ti/Cu, as compared with the etching agent of the present invention (Experimental Example 3). From the results of etching rates of copper in Experimental Examples 1 to 3, it was found that etching using the etching agent of the present invention provides the highest elution amount of copper (copper oxide) from the copper plate, although copper (copper oxide) is eluted from the copper plate in any cases. Nevertheless, it is considered that the phosphonic acid-based chelating agent having a nitrogen atom in the structure, which is the chelating agent relating to the present invention, has the highest chelating capability to copper (copper oxide), and suppresses (prevents) decomposition of hydrogen peroxide by chelating copper (copper oxide), because decomposition of hydrogen peroxide is suppressed most in the etching agent of the present invention.

Example 2: Preparation of the Etching Agent of the Present Invention-2

Hydrogen peroxide (produced by Wako Pure Chemical Industries, Ltd.), diethylenetriamine penta(methylenephosphonic acid) 7-sodium salt (32% aqueous solution) (produced by Italmatch Japan Ltd.), potassium hydroxide (produced by Wako Pure Chemical Industries, Ltd.) and citric acid (produced by KOMATSUYA Corp.) were added into ultra pure water, so as to attain weight % shown in Table 4, stirred as appropriate to obtain the etching agent of the present invention. The obtained etching agent had a pH of 9.0. The etching agent was referred to as an etching agent 4.

Comparative Example 3: Preparation of Comparative Etching Agent-3

Hydrogen peroxide (produced by Wako Pure Chemical Industries, Ltd.), diethylenetriamine penta(methylenephosphonic acid) 7-sodium salt (32% aqueous solution) (produced by Italmatch Japan Ltd.), potassium hydroxide (produced by Wako Pure Chemical Industries, Ltd.) and tartaric acid (produced by Wako Pure Chemical Industries, Ltd.) were added into ultra pure water, so as to attain weight % shown in Table 4, stirred as appropriate to obtain a comparative etching agent. The obtained etching agent had a pH of 9.0. The etching agent was referred to as an etching agent 5.

Comparative Example 4: Preparation of Comparative Etching Agent-4

Hydrogen peroxide (produced by Wako Pure Chemical Industries, Ltd.), diethylenetriamine penta(methylenephosphonic acid) 7-sodium salt (32% aqueous solution) (produced by Italmatch Japan Ltd.), potassium hydroxide (produced by Wako Pure Chemical Industries, Ltd.) and malic acid (produced by Wako Pure Chemical Industries, Ltd.) were added into ultra pure water, so as to attain weight % shown in Table 4, stirred as appropriate to obtain a comparative etching agent. The obtained etching agent had a pH of 9.0. The etching agent was referred to as an etching agent 6.

Comparative Example 5: Preparation of Comparative Etching Agent-5

Hydrogen peroxide (produced by Wako Pure Chemical Industries, Ltd.), diethylenetriamine penta(methylenephosphonic acid) 7-sodium salt (32% aqueous solution) (produced by Italmatch Japan Ltd.), potassium hydroxide (produced by Wako Pure Chemical Industries, Ltd.) and 1,2,3-propane tricarboxylic acid (produced by Wako Pure Chemical Industries, Ltd.) were added into ultra pure water, so as to attain weight % shown in Table 4, stirred as appropriate to obtain a comparative etching agent. The obtained etching agent had a pH of 9.0. The etching agent was referred to as an etching agent 7.

Comparative Example 6: Preparation of Comparative Etching Agent-6

Hydrogen peroxide (produced by Wako Pure Chemical Industries, Ltd.), diethylenetriamine penta(methylenephosphonic acid) 7-sodium salt (32% aqueous solution) (produced by Italmatch Japan Ltd.), potassium hydroxide (produced by Wako Pure Chemical Industries, Ltd.) and benzotriazole (produced by Wako Pure Chemical Industries, Ltd.) were added into ultra pure water, so as to attain weight % shown in Table 4, stirred as appropriate to obtain a comparative etching agent. The obtained etching agent had a pH of 9.0. The etching agent was referred to as an etching agent 8.

Compositions (components and weight %) of the etching agents of Example 2 and Comparative Examples 3 to 6 are shown in Table 4.

TABLE 4

|  | Comparative Example 2 Etching agent 4 | Comparative Example 3 Etching agent 5 | Comparative Example 4 Etching agent 6 | Comparative Example 5 Etching agent 7 | Comparative Example 6 Etching agent 8 |
|---|---|---|---|---|---|
| Hydrogen peroxide (wt. %) | 24.5 | 24.5 | 24.5 | 24.5 | 24.5 |
| DEPPO (wt. %) | 1.8 | 1.8 | 1.8 | 1.8 | 1.8 |
| Potassium hydroxide (wt. %) | 3.0 | 3.0 | 3.0 | 3.0 | 3.0 |
| Organic acid (Copper anticorrosive) (wt. %) | Citric acid 0.1 | Tartaric acid 0.1 | Malic acid 0.1 | 1,2,3-Propane tricarboxylic acid 0.1 | BTA 0.1 |
| Water (wt. %) | 70.6 | 70.6 | 70.6 | 70.6 | 70.6 |

DEPPO: diethylenetriamine penta(methylenephosphonic acid)
BTA: benzotriazole

Experimental Examples 4 to 8: Immersion Tests of the Etching Agents 4 to 8

Each of the etching agents, obtained in Example 2 and Comparative Examples 3 to 6, was put in a container made of polypropylene, and each two pieces of a titanium plate (manufactured by Rare Metallic Co., Ltd.) with a size of 2 cm×2 cm, and a copper plate (manufactured by Rare Metallic Co., Ltd.) with a size of 2 cm×2 cm was immersed into the etching agent at room temperature (25° C.), for 300 minutes simultaneously. During the etching, each 100 μL of samples was taken at a predetermined time interval (60, 120, 180, 240 and 300 minutes), for metal contained amount analysis and hydrogen peroxide analysis, respectively.

Each etching agent sampled for metal contained amount analysis was diluted to 100 times using a 1% nitric acid aqueous solution, to measure contained amounts of a metallic titanium and a metallic copper, using a plasma emission spectrophotometer (apparatus name: ICP-AES SPS-3100; manufactured by SII Co., Ltd.). From the results of the contained amounts measured, dissolution amounts of the metallic titanium and the metallic copper per unit area of to titanium plate and the copper plate, and etching rates of titanium and copper were calculated. The results are shown in Table 5.

In addition, each etching agent sampled for hydrogen peroxide analysis was diluted in measuring cylinder to 10 mL total, using a 0.5 N sulfuric acid aqueous solution, to calculate contained amount of hydrogen peroxide using a redox titration method, using 0.02 mol/L potassium permanganate. The results are shown in Table 6.

It should be noted that these Experimental Examples are experiments, where the titanium plate and the copper plate were continuously immersed each two pieces by two pieces for 300 minutes at the longest, and the Experimental Examples are model experiments on the assumption of a continuous immersion method of plurality pieces of semiconductor substrates, in practical use of the etching agent, to compare an etching rate and a decomposition ratio of hydrogen peroxide, in the case of continuous use of the same etching agent, by etching plurality pieces of semiconductor substrates for 300 minutes at the longest.

TABLE 5

|  | VExperimental Example 4 Etching agent 4 | | Experimental Example 5 Etching agent 5 | | Experimental Example 6 Etching agent 6 | | Experimental Example 7 Etching agent 7 | | Experimental Example 8 Etching agent 8 | |
|---|---|---|---|---|---|---|---|---|---|---|
| Time (min.) | Ti E/R (nm/min.) | Cu E/R (nm/min.) | Ti E/R (nm/min.) | Cu E/R (nm/min.) | Ti E/R (nm/min.) | Cu E/R (nm/min.) | Ti E/R (nm/min.) | Cu E/R (nm/min.) | Ti E/R (nm/min.) | Cu E/R (nm/min.) |
| 60 | 61 | 0.0 | 65 | 0.7 | 62 | 0.6 | 66 | 0.7 | 63 | 0.0 |
| 120 | 61 | 0.3 | 67 | 0.7 | 63 | 0.7 | 67 | 0.8 | 66 | 0.0 |
| 180 | 64 | 0.6 | 71 | 0.8 | 65 | 0.8 | 70 | 0.9 | 67 | 0.1 |
| 240 | 62 | 0.6 | 71 | 0.9 | 66 | 0.9 | 72 | 1.0 | 68 | 0.3 |
| 300 | 64 | 0.7 | 77 | 1.0 | 70 | 1.0 | 74 | 1.0 | 76 | 0.9 |
| Average value | 62 | 0.4 | 70 | 0.8 | 65 | 0.8 | 70 | 0.9 | 68 | 0.3 |
| Ti/Cu Dissolution speed ratio | 155 | | 88 | | 81 | | 78 | | 227 | |

TABLE 6

|  | Experimental Example 4 Etching agent 4 | | Experimental Example 5 Etching agent 5 | | Experimental Example 6 Etching agent 6 | | Experimental Example 7 Etching agent 7 | | Experimental Example 8 Etching agent 8 | |
|---|---|---|---|---|---|---|---|---|---|---|
| Time (min.) | $H_2O_2$ amount (%) | $H_2O_2$ decomposition ratio (%) | $H_2O_2$ amount (%) | $H_2O_2$ decomposition ratio (%) | $H_2O_2$ amount (%) | $H_2O_2$ decomposition ratio (%) | $H_2O_2$ amount (%) | $H_2O_2$ decomposition ratio (%) | $H_2O_2$ amount (%) | $H_2O_2$ decomposition ratio (%) |
| 0 | 24.5 | 0.0 | 24.5 | 0.0 | 24.5 | 0.0 | 24.5 | 0.0 | 24.5 | 0.0 |
| 60 | 24.3 | 0.8 | 24.2 | 1.2 | 24.4 | 0.4 | 24.3 | 0.8 | 24.3 | 0.8 |
| 120 | 24.0 | 2.0 | 23.8 | 2.9 | 23.9 | 2.4 | 23.7 | 3.3 | 24.1 | 1.6 |
| 180 | 23.9 | 2.4 | 23.5 | 4.1 | 23.3 | 4.9 | 23.1 | 5.7 | 23.4 | 4.5 |
| 240 | 23.6 | 3.7 | 22.7 | 7.3 | 21.9 | 10.6 | 22.2 | 9.4 | 21.8 | 11.0 |
| 300 | 22.5 | 7.8 | 21.1 | 13.9 | 20.9 | 14.7 | 20.4 | 16.7 | 19.0 | 22.4 |

$H_2O_2$ decomposition ratio: (($H_2O_2$ amount (%) at etching 0 min − $H_2O_2$ amount (%) at each time)/$H_2O_2$ amount (%) at etching 0 min) × 100

As is clear from the results of Experimental Examples 4 to 8, it was found that the etching agent (etching agent 4) of the present invention has the lowest decomposition ratio, 7.8%, of hydrogen peroxide after 300 minutes from initiation of etching, as compared with other etching agents (etching agents 5 to 8), and decomposition of hydrogen peroxide is suppresses most (Experimental Example 4). From the results of etching rates of copper in Experimental Examples 4 to 7, it was found that etching by the etching agent of the present invention suppresses most the elution amount of copper (copper oxide) from the copper plate, in the case of continuous use of the etching agent for a long period of time. From these results, it is considered that organic acid having at least one hydroxyl group and at least three carboxyl groups (copper anticorrosive), which is the organic acid (copper anticorrosive) relating to the present invention, is capable of suppressing most the elution of copper (copper oxide) from a copper plate, among organic acids (copper anticorrosive), resulting in suppressing decomposition of hydrogen peroxide caused by copper (copper oxide). In addition, it was found that the etching agent of the present invention suppresses more the decomposition of hydrogen peroxide, in the case of continuous use of the etching agent for a long period of time, even as compared with an etching agent (etching agent 8) containing benzotriazole, which is a conventionally known copper anticorrosive.

Comparative Example 7: Preparation of Comparative Etching Agent-7

Hydrogen peroxide (produced by Wako Pure Chemical Industries, Ltd.), diethylenetriamine penta(methylenephosphonic acid) 7-sodium salt (32% aqueous solution) (produced by Italmatch Japan Ltd.), potassium hydroxide (produced by Wako Pure Chemical Industries, Ltd.) and benzotriazole (produced by Wako Pure Chemical Industries, Ltd.) were added into ultra pure water, so as to attain weight % shown in Table 7, stirred as appropriate to obtain the comparative etching agent. The obtained etching agent had a pH of 9.0. The etching agent was referred to as an etching agent 9.

Comparative Example 8: Preparation of Comparative Etching Agent-8

When hydrogen peroxide (produced by Wako Pure Chemical Industries, Ltd.), ethylenediamine (produced by Wako Pure Chemical Industries, Ltd.), potassium hydroxide (produced by Wako Pure Chemical Industries, Ltd.) and citric acid (produced by KOMATSUYA Corp.) were added into ultra pure water, so as to attain weight % shown in Table 7, hydrogen peroxide and ethylenediamine reacted fiercely, and hydrogen peroxide is abruptly decomposed, therefore it was not able to obtain comparative etching agent 10.

Comparative Example 9: Preparation of Comparative Etching Agent-9

Hydrogen peroxide (produced by Wako Pure Chemical Industries, Ltd.), ethanolamine (produced by Wako Pure Chemical Industries, Ltd.), potassium hydroxide (produced by Wako Pure Chemical Industries, Ltd.) and citric acid (produced by KOMATSUYA Corp.) were added into ultra pure water, so as to attain weight % shown in Table 7, hydrogen peroxide and ethanolamine reacted fiercely, and hydrogen peroxide is abruptly decomposed, therefore it was not able to obtain comparative etching agent 11.

Compositions (components and weight %) of the etching agents of Comparative Examples 7 to 9, together with compositions of the etching agent of Example 1, are shown in Table 7.

TABLE 7

|  | Example 1 Etching agent 1 | Comparative Example 7 Etching agent 9 | Comparative Example 8 Etching agent 10 | Comparative Example 9 Etching agent 11 |
|---|---|---|---|---|
| Hydrogen peroxide (wt. %) | 24.5 | 24.5 | 24.5 | 24.5 |
| Chelating agent (wt. %) | DEPPO 1.5 | DEPPO 1.5 | Ethylenediamine 1.5 | Ethanolamine 1.5 |
| Potassium hydroxide (wt. %) | 3.0 | 3.0 | 3.0 | 3.0 |
| Organic acid (Copper anticorrosive) (wt. %) | Citric acid 0.1 | BTA 0.1 | Citric acid 0.1 | Citric acid 0.1 |
| Water (wt. %) | 70.9 | 70.9 | 70.9 | 70.9 |

DEPPO: diethylenetriamine penta(methylenephosphonic acid)
BTA: benzotriazole

Experimental Example 9: Immersion Test of the Etching Agent 9

The etching agent, obtained in Comparative Example 7, was put into a container made of polypropylene, and each one piece of a titanium plate (manufactured by Rare Metallic Co., Ltd.) with a size of 1 cm×2 cm, and a copper plate (manufactured by Rare Metallic Co., Ltd.) with a size of 2 cm×2 cm was immersed into the etching agent heated at 40° C., for 300 minutes simultaneously. During the etching, each 100 µL of samples was taken at a predetermined time interval (30, 60, 180 and 300 minutes), for metal contained amount analysis and hydrogen peroxide analysis, respectively.

Each etching agent sampled for metal contained amount analysis was diluted to 100 times using a 1% nitric acid aqueous solution, to measure contained amounts of a metallic titanium and a metallic copper, using a plasma emission spectrophotometer (apparatus name: ICP-AES SPS-3100; manufactured by SII Co., Ltd.). From the results of the contained amounts measured, dissolution amounts of the metallic titanium and the metallic copper per unit area of the titanium plate and the copper plate, and etching rates of titanium and copper were calculated. The results, together with results of Experimental Example 1, are shown in Table 8.

In addition, each etching agent sampled for hydrogen peroxide analysis was diluted in measuring cylinder to 10 mL total, using a 0.5 N sulfuric acid aqueous solution, to calculate contained amount of hydrogen peroxide using a redox titration method, using 0.02 mol/L potassium permanganate. The results, together with results of Experimental Example 1, are shown in Table 9.

It should be noted that the Experimental Example is experiments, where the titanium plate and the copper plate were continuously immersed each one piece by one piece for 300 minutes at the longest, and the Experimental Example is model experiment on the assumption of a continuous immersion method of plurality pieces of semiconductor substrates, in practical use of the etching agent, to compare an etching rate and a decomposition ratio of hydrogen peroxide, in the case of continuous use of the same etching agent, by etching plurality pieces of semiconductor substrates for 300 minutes at the longest.

TABLE 8

|  | Experimental Example 1 Etching agent 1 | | Experimental Example 9 Etching agent 9 | |
| --- | --- | --- | --- | --- |
| Time (min.) | Ti E/R (nm/min.) | Cu E/R (nm/min.) | Ti E/R (nm/min.) | Cu E/R (nm/min.) |
| 30 | 158 | 1.8 | 151 | 0.0 |
| 60 | 145 | 1.2 | 153 | 0.4 |
| 180 | 149 | 1.0 | 160 | 0.7 |
| 300 | 138 | 1.1 | 165 | 1.5 |
| Average value | 148 | 1.3 | 157 | 0.7 |
| Ti/Cu Dissolution speed ratio | 114 | | 241 | |

TABLE 9

|  | Experimental Example 1 Etching agent 1 | | Experimental Example 9 Etching agent 9 | |
| --- | --- | --- | --- | --- |
| Time (min.) | $H_2O_2$ amount (%) | $H_2O_2$ decomposition ratio (%) | $H_2O_2$ amount (%) | $H_2O_2$ decomposition ratio (%) |
| 0 | 24.5 | 0.0 | 24.5 | 0.0 |
| 30 | 24.2 | 1.2 | 24.4 | 0.4 |
| 60 | 24.0 | 1.8 | 24.1 | 1.6 |
| 180 | 23.1 | 5.5 | 22.1 | 9.8 |
| 300 | 20.8 | 14.8 | 17.6 | 28.2 |

$H_2O_2$ decomposition ratio: (($H_2O_2$ amount (%) at etching 0 min − $H_2O_2$ amount (%) at each time)/$H_2O_2$ amount (%) at etching 0 min) × 100

In the etching agent (etching agent 9) of Experimental Example 9, contained amount of diethylenetriamine penta (methylenephosphonic acid), which is the chelating agent relating to the present invention, was set 1.5% by weight lower by 0.3% by weight as compared with the etching agent (etching agent 8) of Experimental Example 8, and it was confirmed to what extent the elution amount of copper (copper oxide) from the copper plate influences on decomposition of hydrogen peroxide. As is clear from the results of Experimental Examples 1 and 9, etching by the etching agent (etching agent 1) of the present invention shows more total elution amount of copper (copper oxide) from the copper plate, as compared with the etching agent (etching agent 9) containing benzotriazole, which is a conventionally known copper anticorrosive. The etching agent (etching agent 1) of the present invention of Experimental Example 1 and the etching agent (etching agent 9) of Experimental Example 9 differ only in kind of the copper anticorrosive, and thus in only the viewpoint of anticorrosion effect of the copper anticorrosive, etching by the etching agent (etching agent 9) of Experimental Example 9 should suppress decomposition of hydrogen peroxide, because of lower elution amount of copper (copper oxide) from the copper plate. However, as is clear from the results of Table 9, such result was obtained that the etching agent (etching agent 9) of Experimental Example 9 rather promotes decomposition of hydrogen peroxide faster by about two times, as compared with the etching agent (etching agent 1) of the present invention of Experimental Example 1. Although detail reason is not certain, it was suggested that benzotriazole gives adverse influence on hydrogen peroxide, which indicates that it is not necessarily true that decomposition of hydrogen peroxide can be suppressed if only elution of copper (copper oxide) from the metallic copper or the copper plate is suppressed. In addition, as is clear from the results of Comparative Examples 8 and 9, such result was obtained that in the etching agent (etching agent 10) containing ethylenediamine, which is a conventionally known chelating agent, and the etching agent (etching agent 11) containing ethanolamine, these chelating agents react with hydrogen peroxide, and hydrogen peroxide is abruptly decomposed. From these results, it was found that any copper anticorrosive, that suppresses elution of copper (copper oxide) from the metallic copper or the copper plate, is not necessarily good, but it should be a copper anticorrosive effectively suppresses elution of copper (copper oxide) from the metallic copper or the copper alloy without giving adverse influence on hydrogen peroxide, as well as any chelating agents, that is capable of capturing (chelating) copper (copper oxide), is not necessarily good, but it should be a chelating agent capturing (chelating) effectively copper (copper oxide) without giving adverse influence on hydrogen peroxide. From the above results, it was found that the organic acid relating to the present invention, such as, citric acid should be selected as a copper anticorrosive, and the phosphonic acid-based chelating agent having a nitrogen atom in the structure should be selected as a chelating agent, in order to selectively etch the Ti-based metal while suppressing decomposition of hydrogen peroxide.

Examples 3 to 6: Preparation of the Etching Agent of the Present Invention 3 to 6

Hydrogen peroxide (produced by Wako Pure Chemical Industries, Ltd.), diethylenetriamine penta (methylenephosphonic acid) 7-sodium salt (32% aqueous solution) (produced by Italmatch Japan Ltd.), potassium hydroxide (produced by Wako Pure Chemical Industries, Ltd.) and citric acid (produced by KOMATSUYA Corp.) were added into ultra-pure water, so as to attain weight % shown in Table 10, stirred as appropriate to obtain the etching agents of the present invention. The obtained etching agents had a pH of 9.0. The etching agents were referred to as etching agents 12 to 15.

Compositions (components and weight %) of the etching agents of Example 3 to 6 are shown in Table 10.

TABLE 10

|  | Example 3 Etching agent 12 | Example 4 Etching agent 13 | Example 5 Etching agent 14 | Example 6 Etching agent 15 |
| --- | --- | --- | --- | --- |
| Hydrogen peroxide (wt. %) | 24.5 | 24.5 | 24.5 | 24.5 |
| DEPPO (wt. %) | 0.4 | 0.5 | 0.6 | 0.8 |
| Potassium hydroxide (wt. %) | 3.0 | 3.0 | 3.0 | 3.0 |
| Citric acid (wt. %) | 0.1 | 0.1 | 0.1 | 0.1 |
| Water (wt. %) | 72.0 | 71.9 | 71.8 | 71.6 |

DEPPO: diethylenetriamine penta(methylenephosphonic acid)

Experimental Examples 10 to 13: Immersion Tests of the Etching Agents 12 to 15

Each of the etching agents, obtained in Examples 3 to 6, was put in a container made of polypropylene, and each one piece of a titanium plate (manufactured by Rare Metallic Co., Ltd.) with a size of 1 cm×2 cm, and a copper plate (manufactured by Rare Metallic Co., Ltd.) with a size of 2 cm×2 cm was immersed into the etching agent heated at 40°

C., for 300 minutes simultaneously. During the etching, each 100 μL of samples was taken at a predetermined time interval (30, 60, 180 and 300 minutes), for metal contained amount analysis and hydrogen peroxide analysis, respectively.

Each etching agent sampled for metal contained amount analysis was diluted to 100 times using a 1% nitric acid aqueous solution, to measure contained amounts of a metallic titanium and a metallic copper, using a plasma emission spectrophotometer (apparatus name: ICP-AES SPS-3100; manufactured by SII Co., Ltd.). From the results of the contained amounts measured, dissolution amounts of the metallic titanium and the metallic copper per unit area of the titanium plate and the copper plate, and etching rates of titanium and copper were calculated. The results are shown in Table 11.

In addition, each etching agent sampled for hydrogen peroxide analysis was diluted in measuring cylinder to 10 mL total, using a 0.5 N sulfuric acid aqueous solution, to calculate contained amount of hydrogen peroxide using a redox titration method, using 0.02 mol/L potassium permanganate. The results are shown in Table 12.

It should be noted that these Experimental Examples are experiments, where the titanium plate and the copper plate were continuously immersed each one piece by one piece for 300 minutes at the longest, and the Experimental Examples are model experiments on the assumption of a continuous immersion method of plurality pieces of semiconductor substrates, in practical use of the etching agent, to compare an etching rate and a decomposition ratio of hydrogen peroxide, in the case of continuous use of the same etching agent, by etching plurality pieces of semiconductor substrates for 300 minutes at the longest.

As is clear from the results of Experimental Examples 10 to 13, it was found that the higher contained amount of the chelating agent relating to the present invention is capable of suppressing the decomposition of hydrogen peroxide, caused by copper (copper oxide). In addition, it was found that etching using any etching agents has high dissolution speed ratio of Ti/Cu, and is capable of suppressing decomposition of hydrogen peroxide.

Example 7: Preparation of the Etching Agent of the Present Invention-7

Hydrogen peroxide (produced by Wako Pure Chemical Industries, Ltd.), diethylenetriamine penta(methylenephosphonic acid) 7-sodium salt (32% aqueous solution) (produced by Italmatch Japan Ltd.), sodium hydroxide (produced by Wako Pure Chemical Industries, Ltd.) and citric acid (produced by KOMATSUYA Corp.) were added into ultra pure water, so as to attain weight % shown in Table 13, stirred as appropriate to obtain the etching agent of the present invention. The obtained etching agent had a pH of 9.2. The etching agent was referred to as an etching agent 16.

Example 8: Preparation of the Etching Agent of the Present Invention-8

Hydrogen peroxide (produced by Wako Pure Chemical Industries, Ltd.), diethylenetriamine penta(methylenephosphonic acid) 7-sodium salt (32% aqueous solution) (produced by Italmatch Japan Ltd.), sodium hydroxide (produced by Wako Pure Chemical Industries, Ltd.) and citric acid (produced by KOMATSUYA Corp.) were added into ultra pure water, so as to attain weight % shown in Table 13, stirred as appropriate to obtain the etching agent of the present invention. The obtained etching agent had a pH of 9.0. The etching agent was referred to as an etching agent 17.

TABLE 11

|  | Experimental Example 10 Etching agent 12 | | Experimental Example 11 Etching agent 13 | | Experimental Example 12 Etching agent 14 | | Experimental Example 13 Etching agent 15 | |
| --- | --- | --- | --- | --- | --- | --- | --- | --- |
| Time (min.) | Ti E/R (nm/min.) | Cu E/R (nm/min.) | Ti E/R (nm/min.) | Cu E/R (nm/min.) | Ti E/R (nm/min.) | Cu E/R (nm/min.) | Ti E/R (nm/min.) | Cu E/R (nm/min.) |
| 30 | 145 | 0.0 | 168 | 0.0 | 165 | 0.0 | 154 | 0.0 |
| 60 | 151 | 0.0 | 168 | 0.2 | 168 | 0.3 | 159 | 0.3 |
| 180 | 159 | 0.3 | 177 | 0.4 | 183 | 0.5 | 176 | 0.6 |
| 300 | 173 | 0.3 | 178 | 0.4 | 189 | 0.6 | 176 | 0.7 |
| Average value | 157 | 0.1 | 173 | 0.3 | 176 | 0.4 | 166 | 0.4 |
| Ti/Cu Dissolution speed ratio | 1209 | | 686 | | 502 | | 442 | |

TABLE 12

|  | Experimental Example 10 Etching agent 12 | | Experimental Example 11 Etching agent 13 | | Experimental Example 12 Etching agent 14 | | Experimental Example 13 Etching agent 15 | |
| --- | --- | --- | --- | --- | --- | --- | --- | --- |
| Time (min.) | $H_2O_2$ amount (%) | $H_2O_2$ decomposition ratio (%) | $H_2O_2$ amount (%) | $H_2O_2$ decomposition ratio (%) | $H_2O_2$ amount (%) | $H_2O_2$ decomposition ratio (%) | $H_2O_2$ amount (%) | $H_2O_2$ decomposition ratio (%) |
| 0 | 24.5 | 0.0 | 24.5 | 0.0 | 24.5 | 0.0 | 24.5 | 0.0 |
| 30 | 24.4 | 0.4 | 24.5 | 0.0 | 24.5 | 0.0 | 24.4 | 0.4 |
| 60 | 24.2 | 1.2 | 24.4 | 0.4 | 24.4 | 0.4 | 24.4 | 0.4 |
| 180 | 23.6 | 3.7 | 24.0 | 2.0 | 24.2 | 1.2 | 24.2 | 1.2 |
| 300 | 21.7 | 11.4 | 22.0 | 10.2 | 22.1 | 9.8 | 22.3 | 9.0 |

$H_2O_2$ decomposition ratio: (($H_2O_2$ amount (%) at etching 0 min − $H_2O_2$ amount (%) at each time)/$H_2O_2$ amount (%) at etching 0 min) × 100

Example 9: Preparation of the Etching Agent of the Present Invention-9

Hydrogen peroxide (produced by Wako Pure Chemical Industries, Ltd.), diethylenetriamine penta(methylenephosphonic acid) 7-sodium salt (32% aqueous solution) (produced by Italmatch Japan Ltd.), lithium hydroxide (produced by Wako Pure Chemical Industries, Ltd.) and citric acid (produced by KOMATSUYA Corp.) were added into ultra pure water, so as to attain weight % shown in Table 13, stirred as appropriate to obtain the etching agent of the present invention. The obtained etching agent had a pH of 9.0. The etching agent was referred to as an etching agent 18.

Compositions (components and weight %) of the etching agents of Examples 7 to 9, together with compositions of the etching agent of Example 1, are shown in Table 13.

TABLE 13

|  | Example 1 Etching agent 1 | Example 7 Etching agent 16 | Example 8 Etching agent 17 | Example 9 Etching agent 18 |
|---|---|---|---|---|
| Hydrogen peroxide (wt. %) | 24.5 | 24.5 | 24.5 | 24.5 |
| DEPPO (wt. %) | 1.5 | 1.5 | 1.5 | 1.5 |
| Alkali metal hydroxide | KOH | NaOH | NaOH | LiOH |
| (wt. %) | 3.0 | 3.0 | 2.8 | 1.7 |
| Citric acid (wt. %) | 0.1 | 0.1 | 0.1 | 0.1 |
| Water (wt. %) | 70.9 | 70.9 | 71.1 | 72.2 |
| pH | 9.0 | 9.2 | 9.0 | 9.0 |

DEPPO: diethylenetriamine penta(methylenephosphonic acid)
KOH: potassium hydroxide
NaOH: sodium hydroxide
LiOH: lithium hydroxide Experimental Examples 14 to 16: Immersion Tests of the Etching Agents 16 to 18

Each of the etching agents, obtained in Examples 7 to 9, was put in a container made of polypropylene, and each one piece of a titanium plate (manufactured by Rare Metallic Co., Ltd.) with a size of 1 cm×2 cm, and a copper plate (manufactured by Rare Metallic Co., Ltd.) with a size of 2 cm×2 cm was immersed into the etching agent heated at 40° C., for 300 minutes simultaneously. During the etching, each 100 μL of samples was taken at a predetermined time interval (30, 60, 180 and 300 minutes), for metal contained amount analysis and hydrogen peroxide analysis, respectively.

Each etching agent sampled for metal contained amount analysis was diluted to 100 times using a 1% nitric acid aqueous solution, to measure contained amounts of a metallic titanium and a metallic copper, using a plasma emission spectrophotometer (apparatus name: ICP-AES SPS-3100; manufactured by SII Co., Ltd.). From the results of the contained amounts measured, dissolution amounts of the metallic titanium and the metallic copper per unit area of the titanium plate and the copper plate, and etching rates of titanium and copper were calculated. The results are shown in Table 14.

In addition, each etching agent sampled for hydrogen peroxide analysis was diluted in measuring cylinder to 10 mL total, using a 0.5 N sulfuric acid aqueous solution, to calculate contained amount of hydrogen peroxide using a redox titration method, using 0.02 mol/L potassium permanganate. The results are shown in Table 15.

It should be noted that these Experimental Examples are experiments, where the titanium plate and the copper plate were continuously immersed each one piece by one piece for 300 minutes at the longest, and the Experimental Examples are model experiments on the assumption of a continuous immersion method of plurality pieces of semiconductor substrates, in practical use of the etching agent, to compare an etching rate and a decomposition ratio of hydrogen peroxide, in the case of continuous use of the same etching agent, by etching plurality pieces of semiconductor substrates for 300 minutes at the longest.

TABLE 14

|  | Experimental Example 1 Etching agent 1 | | Experimental Example 14 Etching agent 16 | | Experimental Example 15 Etching agent 17 | | Experimental Example 16 Etching agent 18 | |
|---|---|---|---|---|---|---|---|---|
| Time (min.) | Ti E/R (nm/min.) | Cu E/R (nm/min.) | Ti E/R (nm/min.) | Cu E/R (nm/min.) | Ti E/R (nm/min.) | Cu E/R (nm/min.) | Ti E/R (nm/min.) | Cu E/R (nm/min.) |
| 30 | 158 | 1.8 | 311 | 0.5 | 219 | 0.3 | 166 | 0.0 |
| 60 | 145 | 1.2 | 309 | 0.5 | 214 | 0.4 | 173 | 0.0 |
| 180 | 149 | 1.0 | 343 | 0.7 | 242 | 0.5 | 187 | 0.0 |
| 300 | 138 | 1.1 | 340 | 0.8 | 235 | 0.5 | 191 | 0.0 |
| Average value | 148 | 1.3 | 326 | 0.6 | 227 | 0.4 | 179 | 0.0 |
| Ti/Cu Dissolution speed ratio | 114 | | 532 | | 581 | | 11883 | |

TABLE 15

|  | Experimental Example 1 Etching agent 1 | | Experimental Example 14 Etching agent 16 | | Experimental Example 15 Etching agent 17 | | Experimental Example 16 Etching agent 18 | |
|---|---|---|---|---|---|---|---|---|
| Time (min.) | $H_2O_2$ amount (%) | $H_2O_2$ decomposition ratio (%) | $H_2O_2$ amount (%) | $H_2O_2$ decomposition ratio (%) | $H_2O_2$ amount (%) | $H_2O_2$ decomposition ratio (%) | $H_2O_2$ amount (%) | $H_2O_2$ decomposition ratio (%) |
| 0 | 24.5 | 0.0 | 24.5 | 0.0 | 24.5 | 0.0 | 24.5 | 0.0 |
| 30 | 24.2 | 1.2 | 24.4 | 0.4 | 24.2 | 1.2 | 24.4 | 0.4 |
| 60 | 24.0 | 1.8 | 24.0 | 2.0 | 23.8 | 2.9 | 24.3 | 0.8 |

TABLE 15-continued

|  | Experimental Example 1 Etching agent 1 | | Experimental Example 14 Etching agent 16 | | Experimental Example 15 Etching agent 17 | | Experimental Example 16 Etching agent 18 | |
|---|---|---|---|---|---|---|---|---|
| Time (min.) | $H_2O_2$ amount (%) | $H_2O_2$ decomposition ratio (%) | $H_2O_2$ amount (%) | $H_2O_2$ decomposition ratio (%) | $H_2O_2$ amount (%) | $H_2O_2$ decomposition ratio (%) | $H_2O_2$ amount (%) | $H_2O_2$ decomposition ratio (%) |
| 180 | 23.1 | 5.5 | 23.0 | 6.1 | 23.3 | 4.9 | 23.4 | 4.5 |
| 300 | 20.8 | 14.8 | 20.7 | 15.5 | 21.6 | 11.8 | 22.7 | 7.3 |

$H_2O_2$ decomposition ratio: (($H_2O_2$ amount (%) at etching 0 min − $H_2O_2$ amount (%) at each time)/$H_2O_2$ amount (%) at etching 0 min) × 100

As is clear from the results of Experimental Examples 1 and 14 to 16, it was found that among alkali metal hydroxides relating to the present invention, etching by the etching agent (etching agents 16 to 18) containing lithium hydroxide and sodium hydroxide provides higher etching rate of titanium, resulting in having higher dissolution speed ratio of Ti/Cu. In addition, it was found that the etching agents are capable of suppressing decomposition of hydrogen peroxide in the same or lower extent, as compared with the etching agent containing potassium hydroxide (etching agent 1). From these results, it was found that lithium hydroxide and sodium hydroxide are preferable alkali metal hydroxides, among alkali metal hydroxides relating to the present invention.

Example 10: Preparation of the Etching Agent of the Present Invention-10

Hydrogen peroxide (produced by Wako Pure Chemical Industries, Ltd.), diethylenetriamine penta(methylenephosphonic acid) 7-sodium salt (32% aqueous solution) (produced by Italmatch Japan Ltd.), potassium hydroxide (produced by Wako Pure Chemical Industries, Ltd.) and citric acid (produced by KOMATSUYA Corp.) were added into ultra pure water, so as to attain weight % shown in Table 16, stirred as appropriate to obtain the etching agent of the present invention. The obtained etching agent had a pH of 9.0. The etching agent was referred to as an etching agent 19.

Example 11: Preparation of the Etching Agent of the Present Invention-11

Hydrogen peroxide (produced by Wako Pure Chemical Industries, Ltd.), ethylenediamine tetra(methylenephosphonic acid) (produced by DOJINDO LABORATORIES), potassium hydroxide (produced by Wako Pure Chemical Industries, Ltd.) and citric acid (produced by KOMATSUYA Corp.) were added into ultra pure water, so as to attain weight % shown in Table 16, stirred as appropriate to obtain the etching agent of the present invention. The obtained etching agent had a pH of 9.0. The etching agent was referred to as an etching agent 20.

Example 12: Preparation of the Etching Agent of the Present Invention-12

Hydrogen peroxide (produced by Wako Pure Chemical Industries, Ltd.), nitrilotris(methylenephosphonic acid) (50% aqueous solution) (produced by Tokyo Chemical Industry Co., Ltd.), potassium hydroxide (produced by Wako Pure Chemical Industries, Ltd.) and citric acid (produced by KOMATSUYA Corp.) were added into ultra pure water, so as to attain weight % shown in Table 16, stirred as appropriate to obtain the etching agent of the present invention. The obtained etching agent had a pH of 9.0. The etching agent was referred to as an etching agent 21.

Comparative Example 10: Preparation of Comparative Etching Agent-10

Hydrogen peroxide (produced by Wako Pure Chemical Industries, Ltd.), 1-hydroxyethane-1,1-bis(phosphonic acid) (60% aqueous solution) (produced by Wako Pure Chemical Industries, Ltd.), potassium hydroxide (produced by Wako Pure Chemical Industries, Ltd.) and citric acid (produced by KOMATSUYA Corp.) were added into ultra pure water, so as to attain weight % shown in Table 16, stirred as appropriate to obtain the etching agent of the present invention. The obtained etching agent had a pH of 9.0. The etching agent was referred to as an etching agent 22.

Compositions (components and weight %) of the etching agents of Examples 10 to 12 and Comparative Example 10 are shown in Table 16.

TABLE 16

|  | Example 10 Etching agent 19 | Example 11 Etching agent 20 | Example 12 Etching agent 21 | Comparative Example 10 Etching agent 22 |
|---|---|---|---|---|
| Hydrogen peroxide (wt. %) | 24.5 | 24.5 | 24.5 | 24.5 |
| Chelating agent (wt. %) | DEPPO 1.5 | EDTPO 1.5 | NTPO 1.5 | HEDPO 1.5 |
| Potassium hydroxide (wt. %) | 3.0 | 3.0 | 3.0 | 3.0 |
| Citric acid (wt. %) | 0.1 | 0.1 | 0.1 | 0.1 |
| Water (wt. %) | 70.9 | 70.9 | 70.9 | 70.9 |

DEPPO: diethylenetriamine penta(methylenephosphonic acid)
EDTPO: ethylenediamine tetra(methylenephosphonic acid)
NTPO: nitrilotris(methylenephosphonic acid)
HEDPO: 1-hydroxyethane-1,1-bis(phosphonic acid)

Experimental Examples 17 to 20: Immersion Tests of the Etching Agents 19 to 22

Each of the etching agents, obtained in Examples 10 to 12 and Comparative Example 10, was put in a container made of polypropylene, and each one piece of a titanium plate (manufactured by Rare Metallic Co., Ltd.) with a size of 3 cm×2 cm, and a copper plate (manufactured by Rare Metallic Co., Ltd.) with a size of 4 cm×2 cm was immersed into the etching agent heated at 40° C., for 300 minutes simultaneously. During the etching, each 100 μL of samples was taken at a predetermined time interval (30, 60, 180 and 300 minutes), for metal contained amount analysis and hydrogen peroxide analysis, respectively.

Each etching agent sampled for metal contained amount analysis was diluted to 100 times using a 1% nitric acid aqueous solution, to measure contained amounts of a metallic titanium and a metallic copper, using a plasma emission spectrophotometer (apparatus name: ICP-AES SPS-3100; manufactured by SII Co., Ltd.). From the results of the contained amounts measured, dissolution amounts of the metallic titanium and the metallic copper per unit area of the titanium plate and the copper plate, and etching rates of titanium and copper were calculated. The results are shown in Table 17.

In addition, each etching agent sampled for hydrogen peroxide analysis was diluted in measuring cylinder to 10 mL total, using a 0.5 N sulfuric acid aqueous solution, to calculate contained amount of hydrogen peroxide using a redox titration method, using 0.02 mol/L potassium permanganate. The results are shown in Table 18.

It should be noted that these Experimental Examples are experiments, where the titanium plate and the copper plate were continuously immersed each one piece by one piece for 300 minutes at the longest, and carried out by increasing the area of the titanium plate by 1.5 to 3 times and the area of the copper plate by 2 times, as compared with experiment conditions of Experimental Examples 1 to 16. The Experimental Examples are model experiments, under severer conditions as compared with the case of using the practical etching agent, and is the one to confirm difference of decomposition suppression effect of hydrogen peroxide by difference of the chelating agent.

As is clear from the results of Experimental Examples 17 to 19, it was found that the etching agent (etching agent 19) containing diethylenetriamine penta(methylenephosphonic acid) and the etching agent (etching agent 21) containing nitrilotris(methylenephosphonic acid) are preferable, and the etching agent (etching agent 21) containing nitrilotris (methylenephosphonic acid) is capable of suppressing most the decomposition of hydrogen peroxide, among the chelating agents relating to the present invention, in the viewpoint of decomposition suppression effect of hydrogen peroxide. In addition, as is clear from the result of Experimental Example 20, it has been understood that in the etching agent (etching agent 22) containing the phosphonic acid-based chelating agent not having a nitrogen atom in the structure, continuous use for a long period of time is difficult, due to abrupt decomposition of hydrogen peroxide by continuous use of the etching agent for a long period of time.

From the above results, it was found that only the etching agent of the present invention, which is combined (B) phosphonic acid-based chelating agent having a nitrogen atom in the structure, and (D) organic acid having at least one hydroxyl group and at least three carboxyl groups, can suppress (prevent) most the decomposition of hydrogen peroxide, without decreasing dissolution speed ratio of Ti/Cu, resulting in a longer solution life-time, and thus attains the etching agent continuously usable for a long period of time. In addition, it was found that the etching agent of the present invention is an etching agent having easy controllability of etching rate, because of having moderate etching rate.

INDUSTRIAL APPLICABILITY

The etching agent of the present invention is an etching agent to be used in processing a Ti-based metal in a

TABLE 17

| | Experimental Example 17 Etching agent 19 | | Experimental Example 18 Etching agent 20 | | Experimental Example 19 Etching agent 21 | | Experimental Example 20 Etching agent 22 | |
|---|---|---|---|---|---|---|---|---|
| Time (min.) | Ti E/R (nm/min.) | Cu E/R (nm/min.) | Ti E/R (nm/min.) | Cu E/R (nm/min.) | Ti E/R (nm/min.) | Cu E/R (nm/min.) | Ti E/R (nm/min.) | Cu E/R (nm/min.) |
| 30 | 139 | 1.7 | 93 | 0.5 | 106 | 2.3 | 118 | 2.4 |
| 60 | 151 | 1.4 | 112 | 0.5 | 107 | 1.9 | 138 | 2.1 |
| 180 | 164 | 1.3 | 120 | 0.3 | 114 | 1.7 | — | — |
| 300 | 147 | 1.3 | 139 | 0.3 | 118 | 1.6 | — | — |
| Average value | 150 | 1.4 | 116 | 0.4 | 111 | 1.9 | — | — |
| Ti/Cu Dissolution speed ratio | 106 | | 301 | | 59 | | — | |

TABLE 18

| | Experimental Example 17 Etching agent 19 | | Experimental Example 18 Etching agent 20 | | Experimental Example 19 Etching agent 21 | | Experimental Example 20 Etching agent 22 | |
|---|---|---|---|---|---|---|---|---|
| Time (min.) | $H_2O_2$ amount (%) | $H_2O_2$ decomposition ratio (%) | $H_2O_2$ amount (%) | $H_2O_2$ decomposition ratio (%) | $H_2O_2$ amount (%) | $H_2O_2$ decomposition ratio (%) | $H_2O_2$ amount (%) | $H_2O_2$ decomposition ratio (%) |
| 0 | 24.5 | 0.0 | 24.5 | 0.0 | 24.5 | 0.0 | 24.5 | 0.0 |
| 30 | 24.5 | 0.0 | 24.4 | 0.4 | 24.3 | 0.8 | 24.0 | 2.0 |
| 60 | 24.3 | 0.8 | 24.2 | 1.2 | 24.3 | 0.8 | 20.5 | 16.3 |
| 180 | 23.6 | 3.7 | 22.5 | 8.2 | 24.1 | 1.6 | 0.0 | 100.0 |
| 300 | 17.2 | 29.8 | 14.8 | 39.6 | 19.7 | 19.6 | 0.0 | 100.0 |

$H_2O_2$ decomposition ratio: (($H_2O_2$ amount (%) at etching 0 min − $H_2O_2$ amount (%) at each time)/$H_2O_2$ amount (%) at etching 0 min) × 100 semiconductor substrate having the Ti-based metal, and more specifically, a preferable etching agent of the Ti-based metal on the semiconductor substrate, having a metallic copper or a copper alloy arranged on the upper part of the Ti-based metal.

The etching method of the present invention is an etching method suitable for processing a Ti-based metal in a semiconductor substrate having the Ti-based metal, and more specifically, an etching method suitable for selective etching of the Ti-based metal on the semiconductor substrate, having the Ti-based metal and a metallic copper or a copper alloy arranged on the upper part of the Ti-based metal.

The etching agent preparation liquid of the present invention is a preparation liquid enabling to provide the etching agent of the present invention by mixing with a solution containing hydrogen peroxide, and is the preparation liquid suitable for preparation of the etching agent of the present invention in use.

The invention claimed is:

1. An etching agent for a titanium-based metal on a semiconductor substrate, having a titanium-based metal and a metallic copper or a copper alloy on the upper part of said titanium-based metal, comprising an aqueous solution containing at least the following (A), (B), (C) and (D):
    (A) hydrogen peroxide;
    (B) diethylenetriamine penta(methylenephosphonic acid);
    (C) potassium hydroxide;
    (D) citric acid.

2. The etching agent according to claim 1, wherein a pH range of the etching agent is 7 to 10.

3. The etching agent according to claim 1, wherein contained amount of (A) hydrogen peroxide is 10 to 33% by weight, contained amount of (B) diethylenetriamine penta(methylenephosphonic acid) is 0.05 to 5% by weight, contained amount of (C) potassium hydroxide is 0.2 to 5% by weight, and contained amount of (D) citric acid is 0.01 to 5% by weight.

4. The etching agent according to claim 1, wherein the aqueous solution substantially consists of (A), (B), (C) and (D).

5. The etching agent according to claim 1, wherein the etching agent is prepared from a solution containing (A) hydrogen peroxide and an etching agent preparation liquid, which comprises an aqueous solution containing (B) diethylenetriamine penta(methylenephosphonic acid), (C) potassium hydroxide and (D) citric acid.

6. The etching agent according to claim 1, wherein the etching agent are prepared by mixing a solution containing 20 to 35% by weight of (A) hydrogen peroxide, and an etching agent preparation liquid, which comprises an aqueous solution containing 1 to 10% by weight of (B) diethylenetriamine penta(methylenephosphonic acid), 4 to 10% by weight of (C) potassium hydroxide and 0.2 to 10% by weight of (D) citric acid, in a mixing ratio of 50:50 to 95:5, on weight ratio basis.

7. An etching agent preparation liquid for preparing an etching agent for a titanium-based metal on a semiconductor substrate, having a titanium-based metal and a metallic copper or a copper alloy on the upper part of said titanium-based metal, comprising an aqueous solution containing at least the following (B), (C) and (D), and being the one for mixing with a solution containing (A) hydrogen peroxide:
    (B) diethylenetriamine penta(methylenephosphonic acid);
    (C) potassium hydroxide;
    (D) citric acid.

8. The etching agent preparation liquid according to claim 7, wherein contained amount of (B) diethylenetriamine penta(methylenephosphonic acid) is 1 to 10% by weight, contained amount of (C) potassium hydroxide is 4 to 10% by weight, and contained amount of (D) citric acid is 0.2 to 10% by weight.

9. The etching agent preparation liquid according to claim 8, wherein the etching agent preparation liquid is used to prepare the etching agent, by mixing with a solution containing 20 to 35% by weight of (A) hydrogen peroxide.

10. The etching agent preparation liquid according to claim 9, wherein a mixing ratio of the solution containing (A) hydrogen peroxide and the etching agent preparation liquid is 50:50 to 90:5, on weight ratio basis.

* * * * *